United States Patent
Ueno et al.

(10) Patent No.: US 10,573,710 B2
(45) Date of Patent: Feb. 25, 2020

(54) DISPLAY DEVICE

(71) Applicant: Sharp Kabushiki Kaisha, Sakai, Osaka (JP)

(72) Inventors: Tetsuya Ueno, Sakai (JP); Ryoh Araki, Sakai (JP); Asahi Yamato, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/462,287

(22) PCT Filed: May 29, 2017

(86) PCT No.: PCT/JP2017/019941
§ 371 (c)(1),
(2) Date: May 20, 2019

(87) PCT Pub. No.: WO2018/220683
PCT Pub. Date: Dec. 6, 2018

(65) Prior Publication Data
US 2019/0371880 A1    Dec. 5, 2019

(51) Int. Cl.
*H01L 27/32* (2006.01)
*H05K 1/14* (2006.01)
*H05K 3/32* (2006.01)
*H05K 1/18* (2006.01)

(52) U.S. Cl.
CPC ...... *H01L 27/3293* (2013.01); *H01L 27/3276* (2013.01); *H05K 1/148* (2013.01); *H05K 1/189* (2013.01); *H05K 3/321* (2013.01); *H05K 2201/10128* (2013.01)

(58) Field of Classification Search
CPC . H01L 27/3293; H01L 27/3276; H05K 1/148; H05K 1/189
See application file for complete search history.

(56) References Cited

U.S. PATENT DOCUMENTS

| | | | |
|---|---|---|---|
| 10,090,334 B2* | 10/2018 | Bae | H01L 27/124 |
| 2004/0100431 A1 | 5/2004 | Yoshida | |
| 2006/0044215 A1 | 3/2006 | Brody et al. | |
| 2010/0177018 A1 | 7/2010 | Wang et al. | |
| 2010/0302284 A1* | 12/2010 | Karaki | G09G 5/006 |
| | | | 345/690 |
| 2012/0268445 A1 | 10/2012 | Ogata et al. | |
| 2015/0233557 A1 | 8/2015 | Aoyama et al. | |
| 2017/0140679 A1 | 5/2017 | Tomoda et al. | |

FOREIGN PATENT DOCUMENTS

| | | |
|---|---|---|
| JP | 2001-242831 A | 9/2001 |
| JP | 2004-177528 A | 6/2004 |
| JP | 2009-282432 A | 12/2009 |
| JP | 2010-160489 A | 7/2010 |
| JP | 2010-281911 A | 12/2010 |
| JP | 2014-081521 A | 5/2014 |
| JP | 2015-166862 A | 9/2015 |
| JP | 2015-194515 A | 11/2015 |
| WO | 2011/068158 A1 | 6/2011 |

OTHER PUBLICATIONS

Official Communication issued in International Patent Application No. PCT/JP2017/019941, dated Aug. 29, 2017.

* cited by examiner

*Primary Examiner* — William H. Mayo, III
*Assistant Examiner* — Hiram E Gonzalez
(74) *Attorney, Agent, or Firm* — Keating & Bennett, LLP

(57) ABSTRACT

In the display device, the plurality of display bodies are jointed together and fixed to the elongated flexible circuit board.

20 Claims, 14 Drawing Sheets

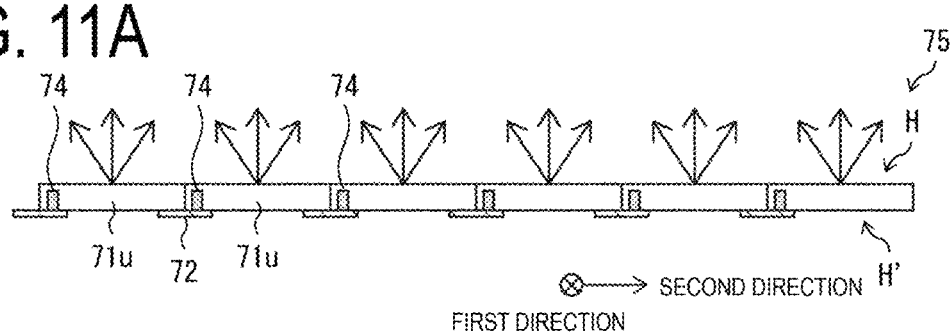
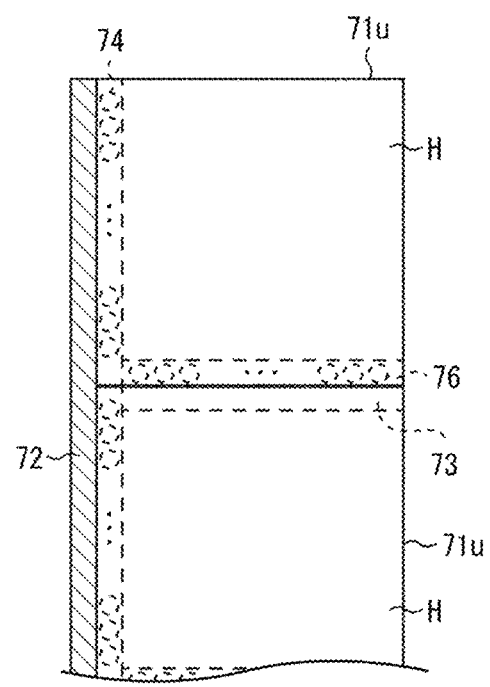
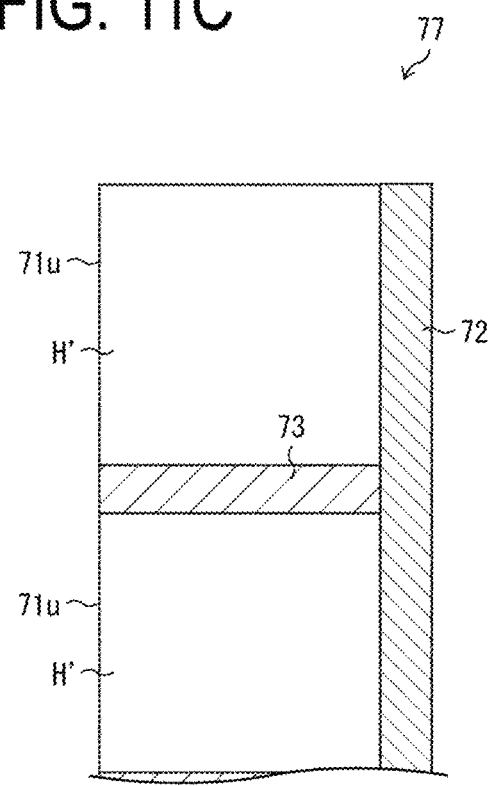

DISPLAY DEVICE

TECHNICAL FIELD

The disclosure relates to a display device in which a plurality of display bodies are jointed together and a method for manufacturing the same.

BACKGROUND ART

In recent years, various flat panel displays have been developed, particularly, an organic Electro Luminescent (EL) display device equipped with an Organic Light Emitting Diode (OLED) and an inorganic EL display device equipped with an inorganic light emitting diode, and the like are attracting attention due to high image quality and low power consumption that these devices achieve.

Unfortunately, in case of a display device formed by process including forming under vacuum a high-definition vapor deposited film using a vapor deposition mask, a uniform and high-definition vapor deposited film is hardly formed on a large mother board (also referred to as a mother substrate), making it difficult to achieve size enlargement or cost reduction of the display device.

PTL 1 describes an electronic device with the display size enlarged by coupling together a plurality of display modules using a plurality of Flexible Printed Circuit Boards (FPCB).

PTL 2 describes a configuration in which one piece of flexible circuit board is commonly connected with a red display panel, a green display panel, and a blue display panel. PTL 2 also states that this configuration reduces the number of flexible circuit boards to be used.

CITATION LIST

Patent Literature

PTL 1: JP 2010-160489 A (published on Jul. 22, 2010)
PTL 2: JP 2009-282432 A (published on Dec. 3, 2009)

SUMMARY

Technical Problem

FIGS. 13A and 13B are views for explaining an issue in an electronic device in which a plurality of display modules described in PTL 1 are coupled to each other using a plurality of flexible circuit boards to enlarge the display size.

As illustrated in FIG. 13A, an electronic device 100 causes a plurality of display modules 100u to be coupled using a plurality of flexible circuit boards 101 to enlarge the display size.

Unfortunately, in the electronic device 100, when viewed from the display face of the display module 100u, the flexible circuit boards 101 or space portions are exposed as they are between two respective adjacent display modules 100u, thus, high image quality cannot be achieved, regardless of the enlarged display size.

As illustrated in FIG. 13B, an electronic device 110 allows a plurality of display modules 110u to be coupled using pluralities of flexible circuit boards 111 and 112 to enlarge the display size.

Respective adjacent display modules 110u in the horizontal direction in the figure are coupled to each other using the flexible circuit board 111, while the respective adjacent display modules 110u in the vertical direction in the figure are coupled to each other using a flexible circuit board 112.

Unfortunately, the electronic device 110, when viewed from the display face of the display module 110u, allows the flexible circuit boards 111 and 112 or the space portions to be exposed as they are between two respective adjacent display modules 110u, thus, high image quality cannot be achieved, regardless of the enlarged display size.

PTL 2 describes a configuration in which one piece of flexible circuit board is commonly coupled with a red display panel, a green display panel, and a blue display panel, which is a configuration in which a red display panel, a green display panel, and a blue display panel overlap with one another in the display face direction to achieve a full color display, where the flexible circuit board is in a folded state as well.

Accordingly, the configuration described in PTL 2 is not allowed to enlarge the display size, and flexible circuit boards or space portions between the color display panels are exposed as they are even if the red display panel, the green display panel, and the blue display panel are extended from non-overlapping state, thus making it impossible to achieve high image quality.

FIGS. 14A to 14D are views for explaining an issue caused when a plurality of display bodies 120u each include a flexible circuit board 121 and a flexible circuit board 123, where the plurality of display bodies 120u are jointed together to manufacture a display device with an enlarged display size.

In order to manufacture a display device in which the plurality of display bodies 120u are jointed together to enlarge the display size, first, as illustrated in FIG. 14A, the flexible circuit board 121 is caused to be crimped with the terminal section of each of the plurality of display bodies 120u using Anisotropic Conductive Film (ACF) to form the display body 120u provided with the flexible circuit board 121.

The flexible circuit board 121 is a flexible circuit board that electrically connects two respective display bodies 120u adjacent to each other in the vertical direction in the figure, that is, that electrically mutually connects the source signal lines provided at an identical position on each of two respective display bodies 120u adjacent to each other in the vertical direction in the figure.

Then, as illustrated in FIG. 14B, the flexible circuit board 123 is caused to be crimped with another terminal section of each of the plurality of display bodies 120u using anisotropic conductive film, to thus form the display body 120u provided with the flexible circuit board 121 and the flexible circuit board 123.

The flexible circuit board 123 is a flexible circuit board that electrically connects two respective display bodies 120u adjacent to each other in the horizontal direction in the figure, that is, that electrically mutually connects the gate signal lines provided at an identical position on each of two respective display bodies 120u adjacent to each other in the horizontal direction in the figure.

In addition, as illustrated in FIG. 14C, the display bodies 120u are each position-adjusted and fixed together along the vertical direction in the figure, and then the display bodies 120u are jointed together to form a group of display bodies 125.

More specifically, in the process illustrated in FIG. 14C, the flexible circuit board 121 electrically connected to the terminal section formed at the lower portion of one display body 120u of two respective display bodies 120u adjacent to each other in the vertical direction in the figure is caused to be crimped with the terminal section formed at the upper portion of the other display body 120u using anisotropic conductive film.

Subsequently, as illustrated in FIG. 14D, groups of display bodies 125 are each position-adjusted and fixed together along the horizontal direction in the figure, and groups of display bodies 125 are jointed together to cause the plurality of display bodies 120u to be jointed together to form the display device with an enlarged display size.

More specifically, in the process illustrated in FIG. 14D, the flexible circuit board 123 electrically connected to the terminal section formed at the left portion of one display body 120u of two respective display bodies 120u adjacent to each other in the horizontal direction in the figure is caused to be crimped with the terminal section formed at the right portion of the other display body 120u using anisotropic conductive film.

Unfortunately, in case of manufacturing a display device in which the plurality of display bodies 120u are jointed together to enlarge the display size, the mounting process of the flexible circuit board 121 illustrated in FIG. 14A, the mounting process of the flexible circuit board 123 illustrated in FIG. 14B, the jointing process of the display body 120u to the flexible circuit board 121 illustrated in FIG. 14C, and the jointing process of the display body 120u to the flexible circuit board 123 illustrated in FIG. 14D are each individually carried out, causing an issue in which the increased number of processes lower the productivity.

The disclosure has been made in view of the above issue, and aims to provide a display device with high productivity and high image quality and a method for the display device.

Solution to Problem

In order to address the above issue, a display device of the disclosure includes a plurality of display bodies and a circuit board, wherein the circuit board is an elongated circuit board having a length not less than a total length of first sides, the first side being in each of the plurality of display bodies, the plurality of display bodies are jointed together and fixed to the elongated circuit board such that the first sides in the plurality of display bodies are aligned along a longitudinal direction of the elongated circuit board, and the elongated circuit board is provided with a plurality of wiring lines each electrically connected to one of a plurality of gate signal lines and a plurality of source signal lines in each of the plurality of display bodies.

The above configuration allows the plurality of display bodies to be jointed together and fixed to the elongated circuit board, thus making it possible to achieve a display device with high productivity and high image quality.

In order to address the above issue, a method for manufacturing a display device includes a plurality of display bodies and a circuit board, wherein the circuit board includes an elongated circuit board having a length not less than a total length of first sides, the first side being in each of the plurality of display bodies, and in fixing the plurality of display bodies to the elongated circuit board, the plurality of display bodies are each position-adjusted and jointed together, and then fixed to the elongated circuit board such that the first sides in the plurality of display bodies are each aligned along a longitudinal direction of the elongated circuit board, to thus cause a plurality of wiring lines of the elongated circuit board to be each electrically connected to one of a plurality of gate signal lines and a plurality of source signal lines in each of the plurality of display bodies.

The above method allows, in fixing the plurality of display bodies to the elongated circuit board, the plurality of display bodies are each position-adjusted and jointed together, and then fixed to the elongated circuit board such that the first sides are each aligned along the longitudinal direction of the elongated circuit board, thus making it possible to achieve a method for manufacturing a display device with high productivity and high image quality.

Advantageous Effects of Disclosure

One aspect of the disclosure provides a display device with high productivity and high image quality, and a method for manufacturing the same.

BRIEF DESCRIPTION OF DRAWINGS

FIG. 11A is a side view of another display device, FIG. 11B is a view partially illustrating the display device when viewed from the display face, FIG. 11C is a view partially illustrating the display device when viewed from the face opposite to the display face.

DESCRIPTION OF EMBODIMENTS

Figure 1A:
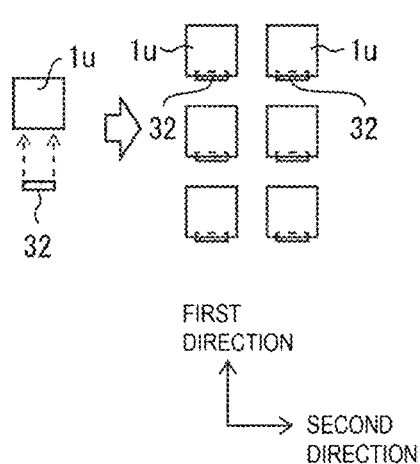
FIGS. 1A to 1D are views for explaining a method for manufacturing a display device formed of a group of display bodies in which a plurality of display bodies are jointed together and fixed to an elongated flexible circuit board.

A description follows regarding embodiments of the disclosure, with reference to FIGS. 1A to 12D. Hereinafter, for convenience of descriptions, a configuration having the same functions as those of a configuration described in a specific embodiment are denoted by the same reference numerals, and its descriptions may be omitted.

Note that, although in each of the embodiments described below, Flexible Printed Circuit Board (FPCB) is described as an example of circuit board, and a non-flexible circuit board may be used in addition to the flexible printed circuit board.

In each of the following embodiments, flexible organic electro luminescence (EL) panel will be described as an example of a display body, flexible display panel other than organic EL panel may be used, or non-flexible display panel may be used, in addition to the flexible organic EL panel.

First Embodiment

A first embodiment of the disclosure will be described with reference to FIGS. 1A to 4C.

FIGS. 1A to 1D are views for explaining a method for manufacturing a display device 35 formed of a group of display bodies in which a plurality of display bodies 1u are jointed together and fixed to an elongated flexible circuit board 33, and a method for manufacturing a display device in which a plurality of display devices 35 are further jointed together.

In order to manufacture a display device in which the plurality of display bodies 1u are jointed together to enlarge the size of the display region, first, as illustrated in FIG. 1A, a flexible circuit board 32 being a short circuit board is caused to be crimped with a terminal section (not illustrated) connected to the source signal lines of each of the plurality of display bodies 1u using anisotropic conductive film (ACF) to form the plurality of display bodies 1u each provided with the flexible circuit board 32.

The flexible circuit board 32 is a flexible circuit board that electrically connects two respective display bodies 1u adjacent to each other in the vertical direction (first direction) in the figure, that is, that electrically mutually connects the source signal lines provided at an identical position on each of two respective display bodies 1u adjacent to each other in the first direction in the figure.

Note that, as will be described in detail below, in the first embodiment, the terminal sections of each of the plurality of display bodies 1u are formed on the face opposite to the display face of the display body 1u, and as illustrated in FIG. 1A, the flexible circuit board 32 is provided on the face opposite to the display face of the display body 1u.

Figure 1B:
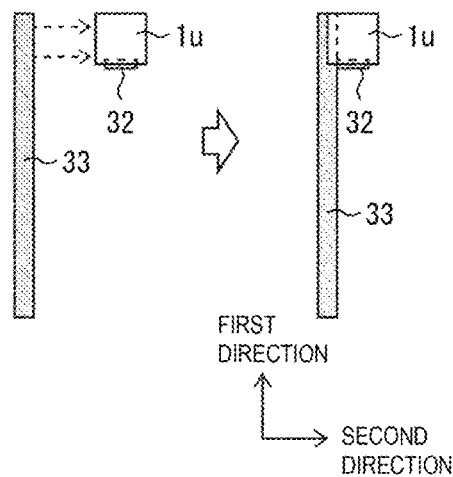

Then, as illustrated in FIG. 1B, one piece of the elongated flexible circuit board 33 is caused to be crimped with another terminal section of each of the plurality of display bodies 1u using anisotropic conductive film.

The elongated flexible circuit board 33 includes a circuit board having a length (the length of the first side) in the first direction in the figure in each of the pluralities of display bodies 1u, that is, having a length in the first direction, where the length is not less than the total length of first sides in each of the pluralities of display bodies 1u in the vertical direction.

In the first embodiment, since it is assumed that the display device 35 formed of a group of display bodies in which six pieces of the display body 1u are jointed together in the first direction in the figure and fixed to the elongated flexible circuit board 33 is to be manufactured, the length of the elongated flexible circuit board 33 in the first direction being the longitudinal direction thereof is set at the total length of six pieces of the display body 1u in the first direction. The length of the elongated flexible circuit board 33 in the first direction being the longitudinal direction thereof may be, in addition to the above, set at not less than the total length of six pieces of the display body 1u in the first direction.

Since the number of the display bodies 1u to be jointed together is determined depending on the size of the display region of the display device to be manufactured, it goes without saying that the number of six in the first embodiment is an example.

The elongated flexible circuit board 33 is a flexible circuit board that electrically connects two respective display bodies 1u adjacent to each other in the horizontal direction (second direction) in the figure, that is, that electrically mutually connects the gate signal lines provided at an identical position on each of two respective display bodies 1u adjacent to each other in the second direction in the figure.

Figure 1C:
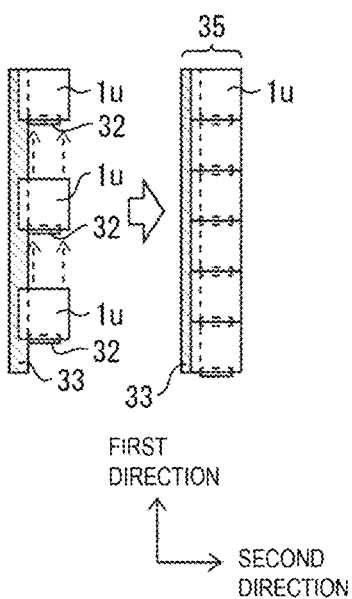

In addition, as illustrated in FIG. 1C, when one piece of the elongated flexible circuit board 33 is to be crimped with and fixed to another terminal section of each of the plurality of display bodies 1u using anisotropic conductive film, the display bodies 1u are jointed together and fixed to the elongated flexible circuit board 33 such that the vertical sides (first sides) in six pieces of the display body 1u are aligned along the first direction being the longitudinal direction of the elongated flexible circuit board 33, to thus form the display device 35 formed of a group of display bodies elongated in the first direction.

Furthermore, as illustrated in FIG. 1C, in a process of fixing each display body 1u to the elongated flexible circuit board 33, the flexible circuit board 32 electrically connected to the terminal section formed at the lower portion of one display body 1u of two respective display bodies 1u adjacent to each other in the first direction in the figure is caused to be crimped with the terminal section formed at the upper portion of the other display body 1u using anisotropic conductive film.

Note that, as will be described in detail below, in the first embodiment, another terminal section of each of the display body 1u is formed on the face opposite to the display face of the display body 1u, and as illustrated in FIGS. 1B and 1C, one piece of the elongated flexible circuit board 33 is provided on the face opposite to the display face of the display body 1u.

The display device 35 allows the plurality of display bodies 1u to be jointed together and fixed to the elongated flexible circuit board 33, thus making it possible to achieve a display device with high productivity and high image quality.

As illustrated in FIG. 1C, when the plurality of display bodies 1u is to be fixed to one piece of the elongated flexible circuit board 33, the plurality of display bodies 1u are each position-adjusted and jointed together, and then fixed to one piece of the elongated flexible circuit board 33 such that the vertical sides (first sides) in the display bodies 1u are aligned along the first direction being the longitudinal direction of the elongated flexible circuit board 33, thus providing high productivity.

Figure 1D:
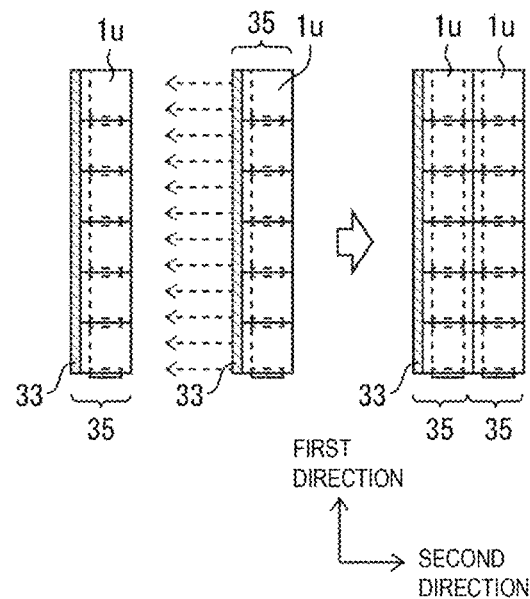

Then, in order to manufacture a display device in which the display devices 35 each formed of a group of display bodies elongated in the first direction are jointed together in the second direction in the figure to manufacture a display device the size of the display region of which is further enlarged, two pieces of the display device 35, as illustrated in FIG. 1D, are jointed together along a second direction orthogonal to the first direction, to thus making it possible to achieve a display device the size of the display region of which is enlarged in the second direction as well.

More specifically, in the process illustrated in FIG. 1D, the elongated flexible circuit board 33 electrically connected to the terminal section formed at the left portion of one display body 1u of two respective display bodies 1u adjacent to each other in the second direction in the figure is caused to be crimped with the terminal section formed at the right portion of the other display body 1u using anisotropic conductive film.

Note that, when the two pieces of the display device 35 are to be jointed together, the elongated flexible circuit board 33 of one display device 35 may be fixed to the face opposite to the display face of the display body 1u of the other display device 35, using, for example, adhesive, double-faced tape (not illustrated), or the like, in addition to the fixation using anisotropic conductive film.

Figure 2:
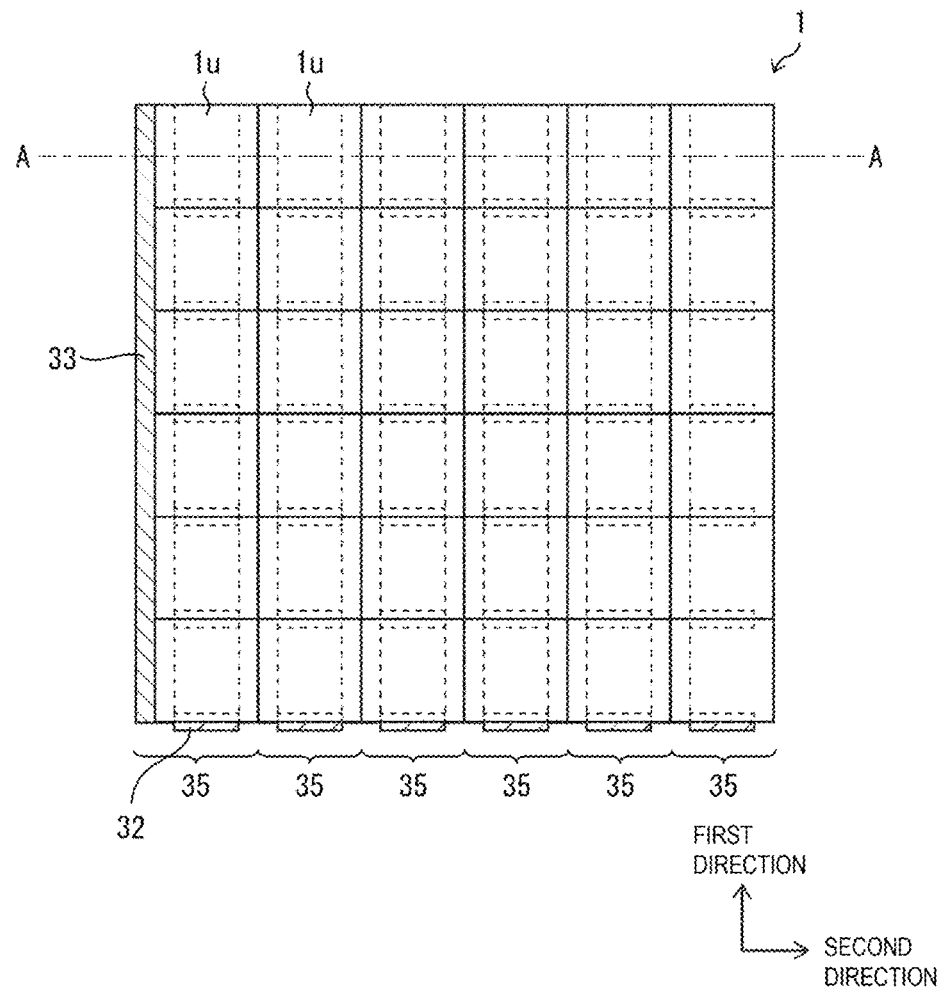
FIG. 2 is a view illustrating an overall configuration of a display device in which the plurality of groups of display bodies illustrated in FIGS. 1A to 1D are jointed together.

FIG. 2 is a view illustrating an overall configuration of a display device 1 in which the display devices 35 each formed of a group of display bodies elongated in the first direction are jointed together in the second direction in the figure to further elongate the size of the display region.

As illustrated in FIG. 2, the display device 1 is a large display device including 36 pieces of the display bodies 1u the display region of which is elongated in the second direction as well, formed using six pieces of the display device 35 each formed of a group of display bodies (a group of display bodies including six pieces of the display body 1u) elongated in the first direction.

As illustrated in the figure, no space (gap) is created between two respective display bodies 1u adjacent to each other in the first direction and in the second direction. Although the flexible circuit board 32 is only exposed at the lower end portion of the display device 1, and the elongated flexible circuit board 33 is only exposed at the left end portion, both the flexible circuit board 32 and the elongated flexible circuit board 33 may be bent to be arranged on the back side of the display device 1.

The lower end portion and the left end portion of the display device 1 overlapping in a plan view with the frame portion covering the architrave portion of the display device 1 enable the flexible circuit board 32 and the elongated flexible circuit board 33 to be made invisible by the frame portion without being bent.

The above configuration makes it possible to achieve the display device 1 with high image quality.

As described above, the electrical connection of the source signal lines between two respective display bodies 1u adjacent to each other in the first direction among the 36 pieces of the display bodies 1u provided in the display device 1 is achieved by the flexible circuit board 32, while the electrical connection of the gate signal lines between two respective display bodies 1u adjacent to each other in the second direction among the 36 pieces of the display bodies 1u provided in the display device 1 is achieved by the elongated flexible circuit board 33.

Accordingly, gate signals may be supplied from one piece of the elongated flexible circuit board 33 only exposed at the left end portion of the display device 1 illustrated in FIG. 2, while the source signals may be supplied from six pieces of the flexible circuit board 32 only exposed at the lower end portion of the display device 1 illustrated in FIG. 2.

Note that the gate driver (gate drive circuit) may be provided in one piece of the elongated flexible circuit board 33 only exposed at the left end portion of the display device 1 illustrated in FIG. 2, or may be provided in an external circuit board (for example, Printed Circuit Board; PCB). In case when the gate driver is provided in the external circuit board, the wiring-line terminal section of the gate driver in the external circuit board may be electrically connected to the wiring line of the elongated flexible circuit board 33 using anisotropic conductive film.

The source driver (source drive circuit) may be provided in six pieces of the flexible circuit board 32 only exposed at the lower end portion of the display device 1 illustrated in FIG. 2, or may be provided in an external circuit board (for example, PCB). In a case when the source driver is provided in the external circuit board, the wiring-line terminal section of the source driver in the external circuit board may be electrically connected to the wiring line of the flexible circuit board 32 using anisotropic conductive film.

Figure 3A:
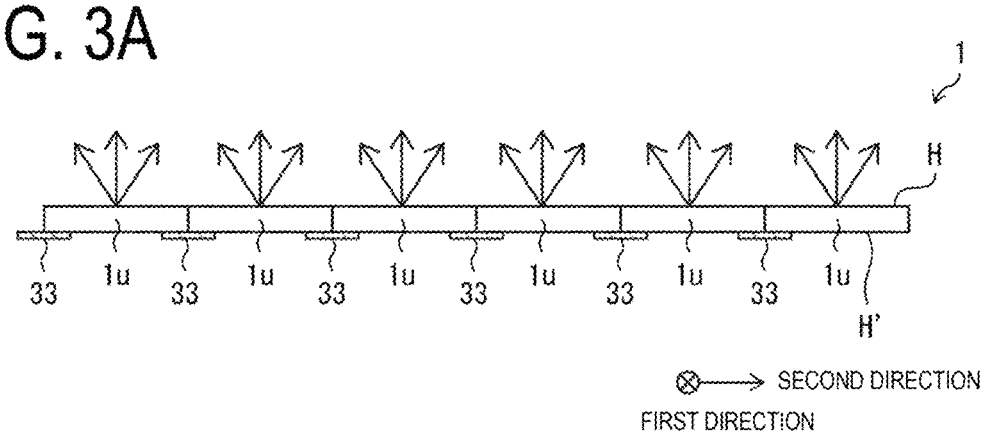
FIG. 3A is a cross-sectional view of the display device taken along line A-A illustrated in FIG. 2.
Figure 3B:
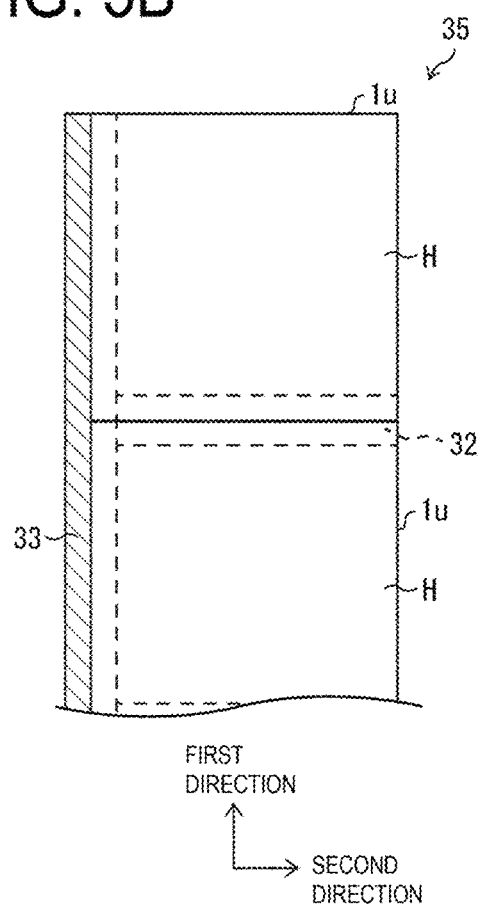
FIG. 3B is a view partially illustrating the display device illustrated in FIG. 2 when viewed from the display face.
Figure 3C:
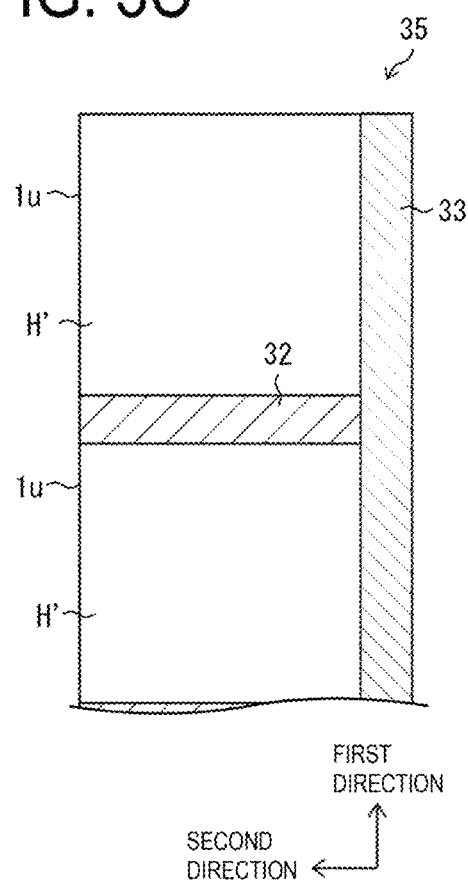
FIG. 3C is a view partially illustrating the display device illustrated in FIG. 2 when viewed from the opposite face to the display face.

FIG. 3A is a cross-sectional view of the display device 1 taken along line A-A illustrated in FIG. 2, FIG. 3B is a view partially illustrating the display device 1 illustrated in FIG. 2 when viewed from a display face H, and FIG. 3C is a view partially illustrating the display device 1 illustrated in FIG. 2 when viewed from an opposite face H' to the display face H.

As illustrated in FIG. 3A, the display face H of the display device 1 is a face from which light emitted from a plurality of organic EL light-emitting elements (not illustrated) provided in each display body 1u comes out, the opposite face H' of the display device 1 is a face opposite to the display face H of the display device 1, where the face is provided with a plurality of terminal sections (not illustrated), a plurality of flexible circuit boards 32, and a plurality of elongated flexible circuit boards 33.

As illustrated in FIGS. 3B and 3C, the display device 35 constituting the display device 1 is provided with the flexible circuit board 32 and the elongated flexible circuit board 33 on the opposite face H' of the display body 1u, which is a face opposite to the display face H of the display body 1u.

Figure 4A:
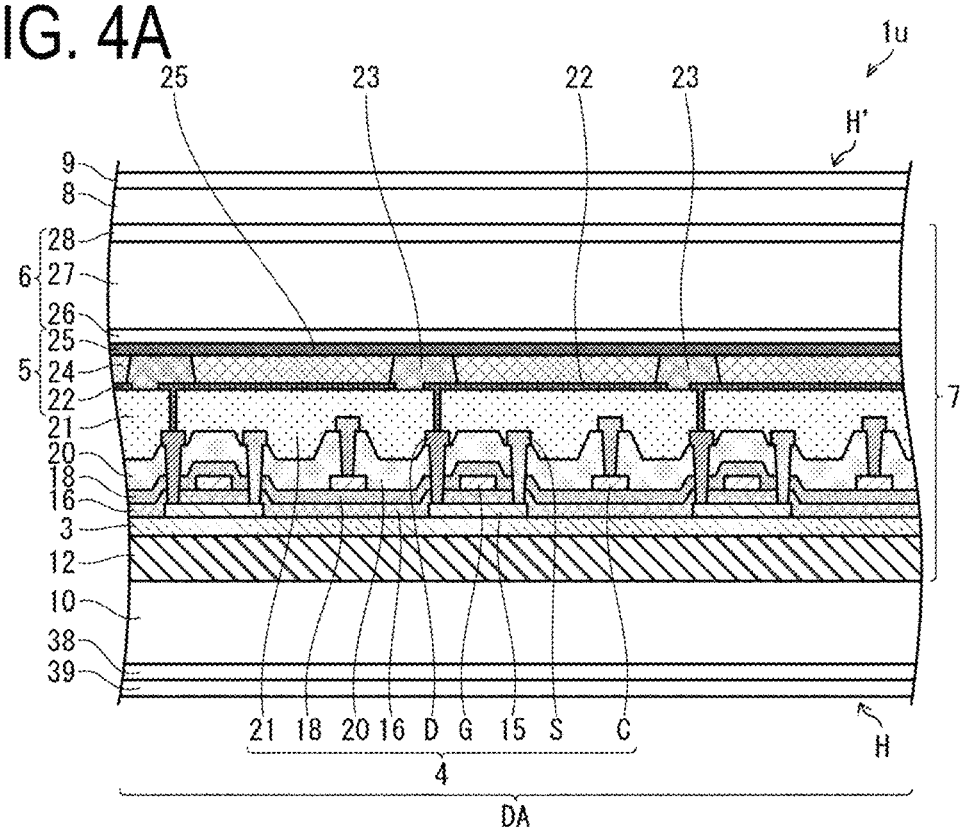
FIG. 4A is a view illustrating an overall configuration of a display region of the display body illustrated in FIGS. 1A to 1D.
Figure 4B:
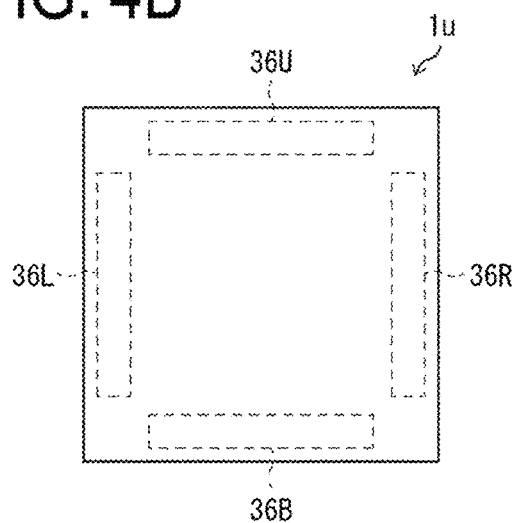
FIG. 4B is a view illustrating an overall configuration of the terminal sections of the display body illustrated in FIGS. 1A to 1D.
Figure 4C:
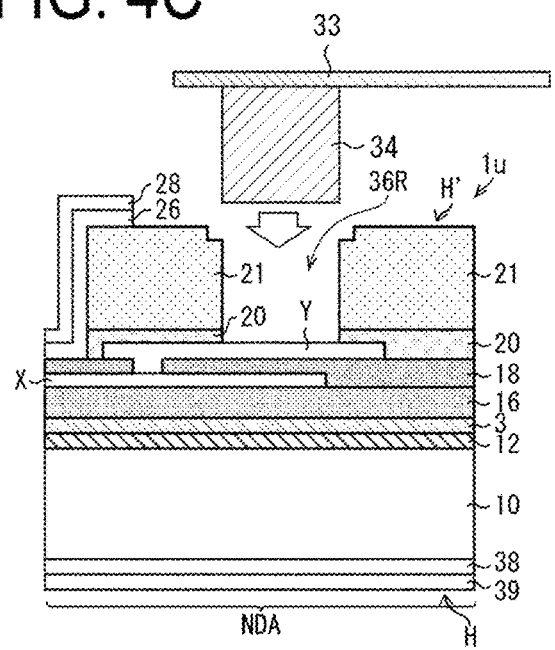
FIG. 4C is a view illustrating an overall configuration of a non-display region of the display body illustrated in FIGS. 1A to 1D.

FIG. 4A is a view illustrating an overall configuration of a display region DA of the display body 1u, FIG. 4B is a view illustrating terminal sections 36U, 36R, 36B, and 36L that are provided on an opposite face H' of the display body 1u, and FIG. 4C is a view illustrating an overall configuration of the non-display region NDA of the display body 1u.

As illustrated in FIG. 4A, a resin layer 12 is formed on a flexible board 10 in the display region DA of the display body 1u, while a barrier layer 3 is formed on the resin layer 12. Further, on the barrier layer 3 is formed a TFT layer 4 including a gate insulating film 16, a first passivation film 18, a second passivation film 20, and an organic interlayer film 21. In addition, on the TFT layer 4 is formed an organic EL light-emitting element 5. Further, a sealing layer 6 including a first inorganic sealing film 26, an organic sealing film 27, and a second inorganic sealing film 28 is formed to cover the organic EL light-emitting element 5.

Note that layers from the resin layer 12 to the second inorganic sealing film 28 on the flexible board 10 is defined as a layered body 7. A protection layer 9 adheres to the layered body 7 with an adhesive layer 8 interposed in between, and the face (the opposite face H' in FIG. 4A) exteriorly exposed in the protection layer 9 defines the display face H of the display body 1u.

Note that, although in the first embodiment, the protection layer 9 is additionally provided, when the protection layer 9 is not provided, the face opposite to the face exteriorly exposed in the second inorganic sealing film 28 forms the display face H of the display body 1u.

Further, a functional layer 39 including a touch panel and a polarizer adheres to the bottom face of the flexible board 10 with an adhesive layer 38 made of an optical clear adhesive (OCA) or an optical clear resin (OCR) interposed in between, and the face (the display face H in FIG. 4A) opposite to the face exteriorly exposed in the functional layer 39 defines the opposite face H' of the display body 1u.

Note that, examples of the material of the flexible board 10 include a film made of polyethylene terephthalate (PET) or the like. Examples of the material of the resin layer 12 include polyimide, epoxy, polyamide, or the like.

The barrier layer 3 is a layer that inhibits moisture or impurities from reaching the TFT layer 4 or the organic EL light-emitting element 5 when a flexible organic EL display device 1 is being used, and may be constituted, for example, by a silicon oxide film, a silicon nitride film, or a silicon oxynitride film, or by a layered film of these films, formed using CVD.

The TFT layer 4 includes a semiconductor film 15, the gate insulating film 16 that is formed above the semiconductor film 15, a gate electrode G that is formed above the gate insulating film 16, the first passivation film 18 and the second passivation film 20 that are formed above the gate electrode G, a capacitor electrode C and the terminal (not illustrated) that are formed above the first passivation film 18, a source wiring line S and a drain wiring line D that are formed above the second passivation film 20, and the organic interlayer film (flattening film) 21 that is formed above the source wiring line S and the drain wiring line D. A thin film transistor (TFT) is configured to include the semiconductor film 15, the gate insulating film 16, and the gate electrode G.

The semiconductor film 15 is formed of, for example, low temperature polysilicon (LTPS) or an oxide semiconductor. The gate insulating film 16 can be formed of, for example, a silicon oxide (SiOx) film, a silicon nitride (SiNx) film, or a layered film thereof formed using a CVD method. The gate electrode G, the source electrode S, the drain electrode D, and the terminal are each formed of a metal single layer film or a layered film including, for example, at least one of aluminum (Al), tungsten (W), molybdenum (Mo), tantalum (Ta), chromium (Cr), titanium (Ti), or copper (Cu). Note that, although in FIG. 2, the TFT is illustrated that has a top gate structure in which the semiconductor film 15 forms the channel, the TFT may include a bottom gate structure (when the TFT channel is the oxide semiconductor, for example).

The gate insulating film 16, the first passivation film 18, and the second passivation film 20 may be formed of, for example, a silicon oxide (SiOx) film, a silicon nitride (SiNx) film, or a layered film of these films, formed using a CVD method. The organic interlayer film 21 can be formed of a coatable photosensitive organic material, such as polyimide or acrylic, for example.

There are formed, above the organic interlayer film 21, a first electrode 22 (for example, an anode electrode), an organic insulating film 23 covering the edges of the first electrode 22, an EL layer 24, which includes a phosphorescent layer, formed above the first electrode 22, and a second electrode 25 formed above the EL layer 24, where the first electrode 22, the EL layer 24, and the second electrode 25 constitute the organic EL light-emitting element 5. The organic insulating film 23 in the display region DA functions as a bank (pixel partition) that defines subpixels.

Note that the organic insulating film 23 may be formed of a coatable photosensitive organic material such as polyimide, or acrylic, for example.

The EL layer 24 including the phosphorescent layer is formed in a region (subpixel region) surrounded by the organic insulating film 23 using a vapor deposition method or an ink-jet method. When an electro-optical element is formed of the organic EL light-emitting element 5, the EL layer 24, which includes the phosphorescent layer, is formed by layering a hole injection layer, a hole transport layer, a light-emitting layer, an electron transport layer, and an electron injection layer sequentially from the lower layer side, for example. Note that one or more layers of the EL layer 24 may be a shared layer (shared by a plurality of pixels).

Note that in the first embodiment, the face, through which light comes out, the light being emitted from the plurality of organic EL light-emitting elements 5 provided in each of the display bodies 1u each being a bottom emission-type organic EL display device, defines the display face H of the display body 1u, where the first electrode 22, which is a layer formed under the second electrode 25, is formed of a transparent electrode made of a transparent metal such as Indium Tin Oxide (ITO), Indium Zinc Oxide (IZO), or the like, and the second electrode 25, which is a layer formed above the first electrode 22, is formed of a reflective electrode configured by layering an Indium Tin Oxide (ITO) and an alloy containing Ag, to have light reflectivity.

In the organic EL light-emitting element 5, holes and electrons are recombined in the EL layer 24 by the driving current between the first electrode 22 and the second electrode 25, and the excitons generated thereby fall to the ground state such that light is emitted.

The sealing layer 6 covers the organic EL light-emitting element 5, and prevents penetration of foreign matter, such as water and oxygen, into the organic EL light-emitting element 5. The sealing layer 6 includes the first inorganic sealing film 26 covering the organic insulating film 23 and the second electrode 25, the organic sealing film 27 that functions as a buffer film, the organic sealing film 27 being formed above the first inorganic sealing film 26, and the second inorganic sealing film 28 covering the first inorganic sealing film 26 and the organic sealing film 27.

Each of the first inorganic sealing film 26 and the second inorganic sealing film 28 may be formed of a silicon oxide film, a silicon nitride film, a silicon oxynitride film, or a layered film thereof formed by a CVD method using a mask. The organic sealing film 27 is a transparent organic insulating film that is thicker than the first inorganic sealing film 26 and the second inorganic sealing film 28, and may be formed of a coatable photosensitive organic material such as polyimide or acrylic. For example, the first inorganic sealing film 26 is coated using an ink-jet method with an ink containing such an organic material, then, the ink may be cured by UV irradiation.

FIG. 4B is a view illustrating the terminal sections 36U, 36R, 36B, and 36L that are provided on the opposite face H' of the display body 1u.

The terminal sections 36U and 36B each form the terminal section of a plurality of source signal lines provided in the display region DA of the display body 1u, while the terminal sections 36R and 36L each form the terminal section of a plurality of gate signal lines provided in the display region DA of the display body 1u.

In each of the terminal sections 36U and 36B, the source signal lines provided at an identical position on each of two respective display bodies 1u adjacent to each other in the vertical direction in the figure are electrically connected to each other via the flexible circuit board 32.

In each of the terminal sections 36R and 36L, the gate signal lines provided at an identical position on each of two respective display bodies 1u adjacent to each other in the horizontal direction in the figure are electrically connected to each other via the elongated flexible circuit board 33.

In the meantime, as illustrated in FIG. 4C, in the terminal section formation region, which is the non-display region NDA of the display body 1u, the gate signal line electrically connected to the gate electrode G of the display region DA of the display body 1u illustrated in FIG. 4C is electrically connected to the wiring line Y via the wiring line X extending to the non-display region NDA of the display body 1u.

Further, a portion, which is formed to cause the wiring line Y to be exposed for an electrical connection of the wiring line Y to the wiring line of the elongated flexible circuit board 33, defines the terminal section 36R (or the terminal section 36L of FIG. 4B).

As illustrated in the figure, in the non-display region NDA of the display body 1u, the wiring line X formed in the same layer as the gate electrode G and the gate signal line is electrically connected to a wiring line Y formed in the same layer as a source signal line S and the drain line D, where the plurality of wiring lines Y is crimped with the wiring lines of the elongated flexible circuit board 33 using an anisotropic conductive film 34.

In this way, the elongated flexible circuit board 33 is fixed to a part of the opposite face H' of the display body 1u.

Although not illustrated, on the opposite face H' of the display body 1u, there are formed terminal sections (terminal sections 36U and 36B in FIG. 4B) for electrically connecting the wiring line of the flexible circuit board 32 to a wiring line extending to the non-display region NDA of the display body 1u from the source signal line S in the display region DA of the display body 1u illustrated in FIG. 4A.

Further, the terminal sections 36U and 36B are crimped with the flexible circuit board 32 using anisotropic conductive film.

In this way, the flexible circuit board 32 is also fixed to a part of the opposite face H' of the display body 1u.

Note that, the elongated flexible circuit board 33 is used in the display device 1 in which the display device 35 formed of a group of display bodies elongated in the first direction and display device 35 formed of a group of display bodies elongated in the first direction, which are described above, are jointed together in the second direction to further enlarge the size of the display region, which enhances the productivity at the time when the display devices 35 are each position-adjusted and jointed together.

In a case of using the elongated flexible circuit board 33, signal lines for supplying signals from the exterior to the elongated flexible circuit board 33 can be collectively arranged at one of the both ends of the elongated flexible circuit board 33 in the longitudinal direction, which makes it possible to collectively arrange the input signal lines through which the input signals are supplied from the exterior.

The wiring line of the elongated flexible circuit board 33 may include a wiring line for supplying high level power supply voltage to the display body 1u. In such a case, a wiring-line resistance of the wiring line for supplying high level power supply voltage can be reduced.

In the meantime, in case of the group of display bodies 125 formed of the plurality of display bodies 120u each including the flexible circuit board 121 and the flexible circuit board 123 that have short length illustrated in FIGS. 14A to 14D, the wiring lines for supplying high-level power supply voltage to the display body 120u are constituted by the wiring lines of the plurality of flexible circuit boards and the display bodies 120u, resulting in high electrical resistance.

In this way, in the first embodiment, a case is described, as an example, in which the signals supplied to the wiring lines provided in the elongated flexible circuit board 33 or the flexible circuit board 32 serve as source signals, gate signals, or power supply voltages, the elongated flexible circuit board 33 or the flexible circuit board 32 may be provided with wiring lines for supplying signals, in addition to the above signals, for example, common voltages or trigger signals.

Second Embodiment

Next, a second embodiment of the disclosure will be described with reference to FIGS. 5A to 5D and FIG. 6. The second embodiment differs from the first embodiment in that a flexible circuit board 40 is crimped with the terminal section of the plurality of gate signal lines of the display body 1u using anisotropic conductive film, and one piece of an elongated flexible circuit board 42 is crimped with the terminal section of the plurality of source signal lines of the display body 1u using anisotropic conductive film. The other configurations are as described in the first embodiment. For convenience of descriptions, members having the same functions as those of the members illustrated in the diagrams in the first embodiment are denoted by the same reference numerals, and descriptions thereof will be omitted.

FIGS. 5A to 5D are views for explaining a method for manufacturing a display device 43 formed of a group of display bodies in which the plurality of display bodies 1u are jointed together and fixed to the elongated flexible circuit board 42, and a method for manufacturing a display device in which a plurality of display devices 43 are further jointed together.

Figure 5A:
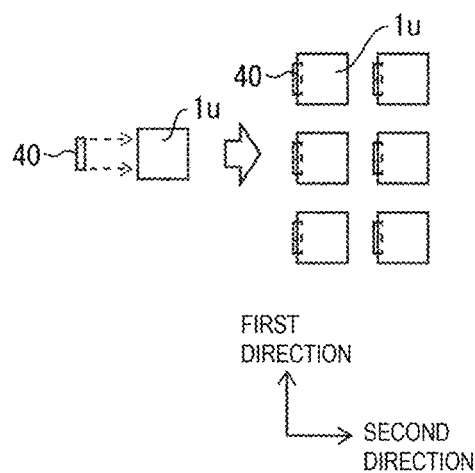
FIGS. 5A to 5D are views for explaining a method for manufacturing a display device formed of another group of display bodies in which a plurality of display bodies are jointed together and fixed to an elongated flexible circuit board.

In order to manufacture a display device in which the plurality of display bodies 1u are jointed together to enlarge the size of the display region, first, as illustrated in FIG. 5A, the flexible circuit board 40 is caused to be crimped with the terminal section of a plurality of gate signal lines of each of the plurality of display bodies 1u using anisotropic conductive film to form the plurality of display bodies 1u each provided with the flexible circuit board 40.

The flexible circuit board 40 is a flexible circuit board that electrically mutually connects the gate signal lines provided at an identical position on each of two respective display bodies 1u adjacent to each other in the second direction in the figure.

Figure 5B:
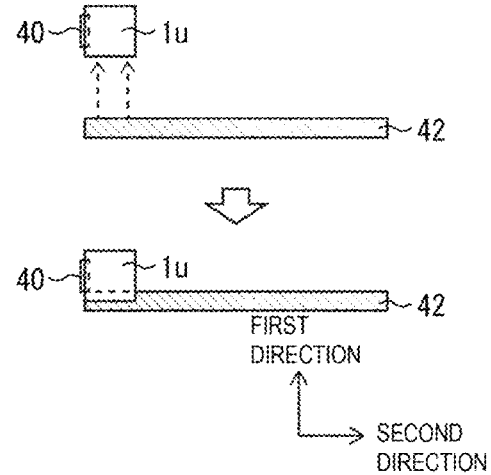

Then, as illustrated in FIG. 5B, one piece of the elongated flexible circuit board 42 is caused to be crimped with the terminal section of a plurality of source signal lines of each of the plurality of display bodies 1u using anisotropic conductive film.

The elongated flexible circuit board 42 is a flexible circuit board that electrically mutually connects the source signal lines provided at an identical position on each of two respective display bodies 1u adjacent to each other in the first direction in the figure.

The elongated flexible circuit board 42 includes a circuit board having a length (the length of the first side) in the second direction in the figure in each of the pluralities of display bodies 1u, that is, having a length in the second direction, where the length is not less than the total length of first sides in each of the pluralities of display bodies 1u in the horizontal direction.

In the second embodiment, since it is assumed that the display device 43 formed of a group of display bodies in which six pieces of the display body 1u are jointed together in the second direction in the figure and fixed to the elongated flexible circuit board 42 is to be manufactured, the length of the elongated flexible circuit board 42 in the second direction being the longitudinal direction thereof is set at the total length of six pieces of the display body 1u in the second direction. The length of the elongated flexible circuit board 42 in the second direction being the longitudinal direction may be, in addition to the above, set at not less than the total length of six pieces of the display body 1u in the second direction.

Since the number of the display bodies 1u to be jointed together is determined depending on the size of the display region of the display device to be manufactured, it goes without saying that the number of six in the first embodiment is an example.

Figure 5C:
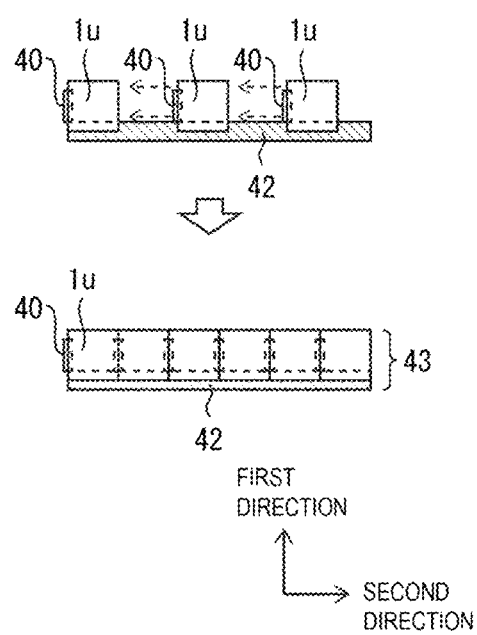

In addition, as illustrated in FIG. 5C, when one piece of the elongated flexible circuit board 42 is to be crimped with and fixed to terminal section of a plurality of source signal lines of each of the plurality of display bodies 1u using anisotropic conductive film, the display bodies 1u are jointed together and fixed to the elongated flexible circuit board 42 such that the horizontal sides (first sides) in six pieces of the display body 1u are aligned along the second direction being the longitudinal direction of the elongated flexible circuit board 42, to thus form the display device 43 formed of a group of display bodies elongated in the second direction.

Furthermore, as illustrated in FIG. 5C, in a process of fixing each display body 1u to the elongated flexible circuit board 42, the flexible circuit board 40 electrically connected to the terminal section of the plurality of source signal lines formed at the left end portion of one display body 1u of two respective display bodies 1u adjacent to each other in the second direction in the figure is caused to be crimped with the terminal section of the plurality of source signal lines formed at the right end portion of the other display body 1u using anisotropic conductive film.

The display device 43 allows the plurality of display bodies 1u to be jointed together and fixed to the elongated flexible circuit board 42, thus making it possible to achieve a display device with high productivity and high image quality.

As illustrated in FIG. 5C, when the plurality of display bodies 1u are to be fixed to one piece of the elongated flexible circuit board 42, the plurality of display bodies 1u are each position-adjusted and jointed together, and then fixed to one piece of the elongated flexible circuit board 42 such that the horizontal sides (first sides) in the display bodies 1u are aligned along the second direction being the longitudinal direction of the elongated flexible circuit board 42, thus providing high productivity.

Figure 5D:
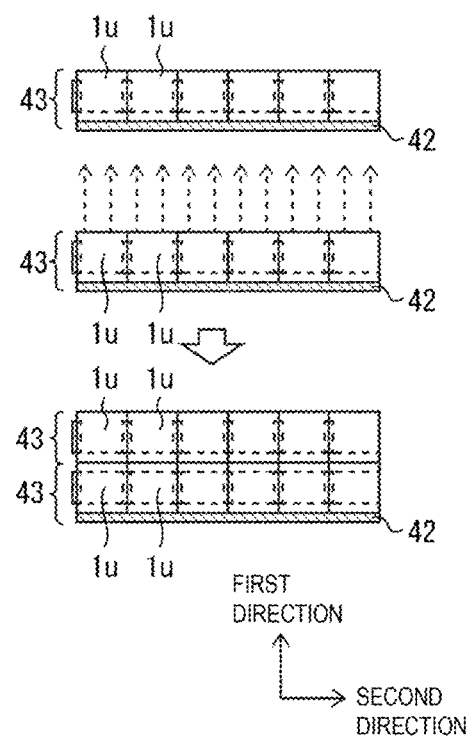

Further, in order to manufacture a display device in which the display devices 43 each formed of a group of display bodies elongated in the second direction are jointed together in the first direction in the figure to manufacture a display device the size of the display region of which is further enlarged, two pieces of the display device 43, as illustrated in FIG. 5D, are jointed together along a first direction orthogonal to the second direction, to thus make it possible to achieve a display device the size of the display region of which is enlarged in the first direction as well.

More specifically, in the process illustrated in FIG. 5D, the elongated flexible circuit board 42 electrically connected to the terminal section formed at the lower portion of one display body 1u of two respective display bodies 1u adjacent to each other in the first direction in the figure is caused to be crimped with the terminal section formed at the upper portion of the other display body 1u using anisotropic conductive film.

Note that, when the two pieces of the display device 43 are to be jointed together, the elongated flexible circuit board 42 of one display device 43 may be fixed to the face opposite to the display face of the display body 1u of the other display device 43, using, for example, adhesive, double-faced tape (not illustrated), or the like, in addition to the fixation using anisotropic conductive film.

Figure 6:
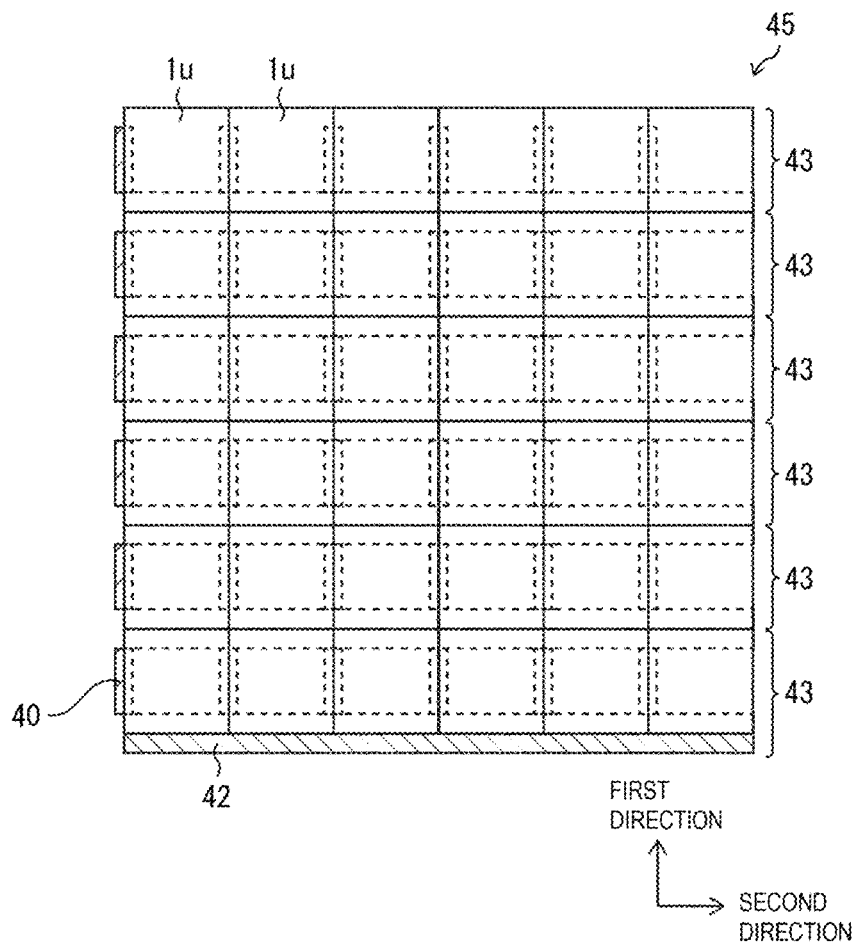
FIG. 6 is a view illustrating an overall configuration of a display device in which the plurality of groups of display bodies illustrated in FIGS. 5A to 5D are jointed together.

FIG. 6 is a view illustrating an overall configuration of a display device 45 in which the display devices 43 each formed of a group of display bodies elongated in the second direction are jointed together in the first direction in the figure to further elongate the size of the display region.

As illustrated in FIG. 6, the display device 45 is a large display device the display region of which is elongated in the first direction as well, formed using six pieces of the display device 43 each formed of a group of display bodies elongated in the second direction.

As illustrated in the figure, no space (gap) is created between the respective adjacent display bodies 1u in the first direction and in the second direction. Although the flexible circuit board 40 is only exposed at the left end portion of the display device 45, and the elongated flexible circuit board 42 is only exposed at the lower end portion, both the flexible circuit board 40 and the elongated flexible circuit board 42 may be bent to be arranged on the back side of the display device 45.

The lower end portion and the left end portion of the display device 45 overlapping in a plan view with the frame portion covering the architrave portion of the display device 45 enable the flexible circuit board 40 and the elongated flexible circuit board 42 to be made invisible by the frame portion without being bent.

The above configuration makes it possible to achieve the display device 45 with high image quality.

Note that, the elongated flexible circuit board 42 is used in the display device 45 in which the display device 43 formed of a group of display bodies elongated in the second direction and the display device 43 formed of a group of display bodies elongated in the second direction, which are described above, are jointed together in the first direction to further enlarge the size of the display region, which enhances the productivity at the time when the display devices 45 are each position-adjusted and jointed together.

In a case of using the elongated flexible circuit board 42, signal lines for supplying signals from the exterior to the elongated flexible circuit board 42 can be collectively arranged at one of the both ends of the elongated flexible circuit board 42 in the longitudinal direction, which makes it possible to collectively arrange the input signal lines through which the input signals are supplied from the exterior.

As described above, the electrical connection of the source signal lines between two respective display bodies 1*u* adjacent to each other in the first direction among the 36 pieces of the display bodies 1*u* provided in the display device 45 is achieved by the elongated flexible circuit board 42, while the electrical connection of the gate signal lines between two respective display bodies 1*u* adjacent to each other in the second direction among the 36 pieces of the display bodies 1*u* provided in the display device 45 is achieved by the flexible circuit board 40.

Accordingly, gate signals may be supplied from six pieces of the elongated flexible circuit board 40 only exposed at the left end portion of the display device 45 illustrated in FIG. 6, while the source signals may be supplied from one piece of the elongated flexible circuit board 42 only exposed at the lower end portion of the display device 45 illustrated in FIG. 6.

Note that the gate driver (gate drive circuit) may be provided in six pieces of the flexible circuit board 40 only exposed at the left end portion of the display device 45 illustrated in FIG. 6, or may be provided in an external circuit board (for example, PCB). In a case when the gate driver is provided in the external circuit board, the wiring-line terminal section of the gate driver on the external circuit board may be electrically connected to the wiring line of the flexible circuit board 40 using anisotropic conductive film.

The source driver (source drive circuit) may be provided in one piece of the elongated flexible circuit board 42 only exposed at the lower end portion of the display device 45 illustrated in FIG. 6, or may be provided in an external circuit board (for example, PCB). In case when the source driver is provided in the external circuit board, the wiring-line terminal section of the source driver in the external circuit board may be electrically connected to the wiring line of the elongated flexible circuit board 42 using anisotropic conductive film.

Third Embodiment

Next, a third embodiment of the disclosure will be described with reference to FIGS. 7A to 7D and FIG. 8. The third embodiment differs from the first and second embodiments in that the gate driver (gate drive circuit) is provided in a form of gate driver monolithic circuitry (GDM) in the display region of the display body 50*u*. The other configurations are as described in the first and second embodiments. For convenience of descriptions, members having the same functions as those of the members illustrated in the diagrams in the first and second embodiments are denoted by the same reference numerals, and descriptions thereof will be omitted.

FIGS. 7A to 7D are views for explaining a method for manufacturing a display device 52 formed of a group of display bodies in which a plurality of display bodies 50*u* are jointed together and fixed to an elongated flexible circuit board 51, where the display body 50*u* includes a gate driver provided in a form of gate driver monolithic circuitry (GDM) in the display region, and a method for manufacturing a display device in which the display devices 52 are further jointed together.

Figure 7A:
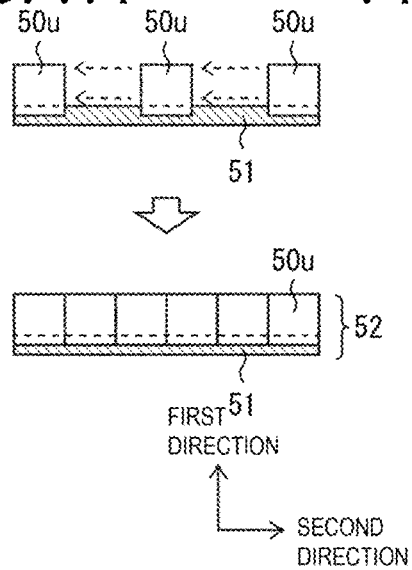
FIGS. 7A, 7B, and 7C are views for explaining a method for manufacturing a display device formed of still another group of display bodies in which a plurality of display bodies are jointed together and fixed to an elongated flexible circuit board, and a method for manufacturing a display device in which the plurality of groups of display bodies are jointed together.

In order to manufacture a display device in which the plurality of display bodies 50*u* are jointed together to enlarge the size of the display region, first, as illustrated in FIG. 7A, one piece of the elongated flexible circuit board 51 is caused to be crimped with the terminal section of each of the plurality of display bodies 50*u* using anisotropic conductive film.

The elongated flexible circuit board 51 includes a circuit board having a length (the length of the first side) in the second direction in the figure in each of the pluralities of the display bodies 50*u*, that is, having a length in the second direction, where the length is not less than the total length of first sides in each of the pluralities of the display bodies 50*u* in the horizontal direction.

In the third embodiment, since it is assumed that the display device 52 formed of a group of display bodies in which six pieces of the display body 50*u* are jointed together in the second direction in the figure and fixed to the elongated flexible circuit board 51 is to be manufactured, the length of the elongated flexible circuit board 51 in the second direction being the longitudinal direction thereof is set at the total length of six pieces of the display body 50*u* in the second direction. The length of the elongated flexible circuit board 51 in the second direction being the longitudinal direction thereof may be, in addition to the above, set at not less than the total length of six pieces of the display body 50*u* in the second direction.

Since the number of the display bodies 50*u* to be jointed together is determined depending on the size of the display region of the display device to be manufactured, it goes without saying that the number of six in the third embodiment is an example.

Figure 7B:
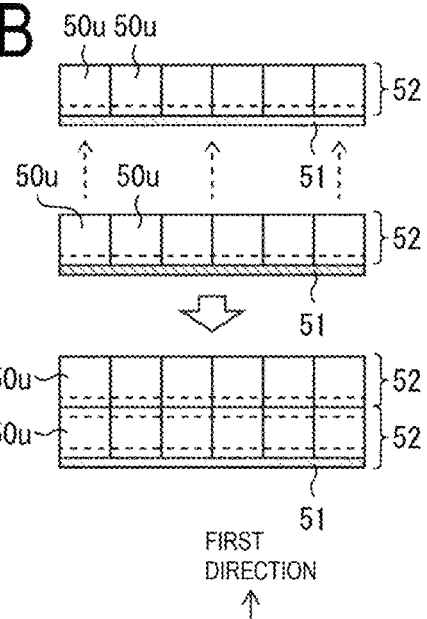

In addition, as illustrated in FIG. 7B, when one piece of the elongated flexible circuit board 51 is to be crimped with and fixed to the terminal section of each of the plurality of display bodies 50*u* using anisotropic conductive film, the display bodies 50*u* are jointed together and fixed to the elongated flexible circuit board 51 such that the horizontal sides (first sides) in six pieces of the display body 50*u* are aligned along the second direction being the longitudinal direction of the elongated flexible circuit board 51, to thus form the display device 52 formed of a group of display bodies elongated in the second direction.

The display device 52 allows the plurality of display bodies 50*u* to be jointed together and fixed to the elongated flexible circuit board 51, thus making it possible to achieve a display device with high productivity and high image quality.

As illustrated in FIG. 7B, when the plurality of display bodies 50*u* is to be fixed to one piece of the elongated flexible circuit board 51, the plurality of display bodies 50*u* are each position-adjusted and jointed together, and then fixed to one piece of the elongated flexible circuit board 51 such that the horizontal sides (first sides) in the display bodies 50*u* are aligned along the second direction being the longitudinal direction of the elongated flexible circuit board 51, thus providing high productivity.

Figure 7C:
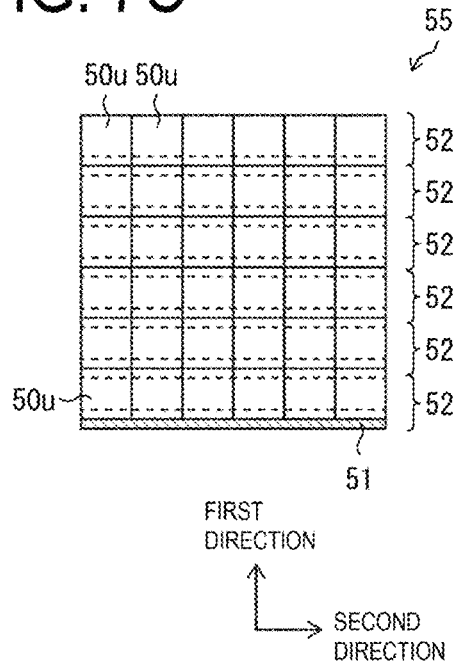

Further, in order to manufacture a display device 55 in which the display devices 52 each formed of a group of display bodies elongated in the second direction are jointed together in the first direction in the figure to manufacture the display device 55 the size of the display region of which is further enlarged, six pieces of the display device 52, as illustrated in FIG. 7C, are jointed together along a first direction orthogonal to the second direction, to thus make it possible to achieve the display device 55 the size of the display region of which is enlarged in the first direction as well.

Figure 7D:
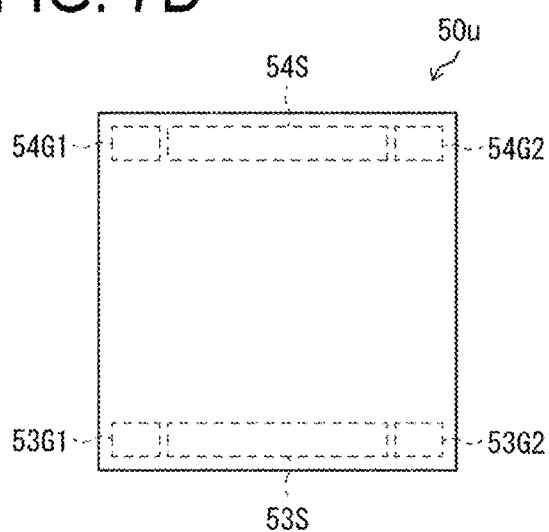
FIG. 7D is a view illustrating an overall configuration of the terminal sections of the display body.

FIG. 7D is a view illustrating an overall configuration of the terminal sections of the display body 50u.

As illustrated in the figure, each of terminal sections 53S and 54S of the display body 50u forms the terminal section of a plurality of source signal lines in the display region DA of the display body 50u.

Further, each of terminal sections 53G1, 53G2, 54G1, and 54G2 of the display body 50u includes the terminal section for supplying control signals to a plurality of gate drivers 56 in the display region DA of the display body 50u, and the terminal section for supplying the control signals to the respective display bodies 50u adjacent to each other in the first direction being the vertical direction in the figure.

In the process illustrated in FIG. 7C, the elongated flexible circuit board 51 electrically connected to the terminal sections 53G1, 53S, and 53G2 formed at the lower portion of one display body 50u of two respective display bodies 50u adjacent to each other in the first direction in the figure is caused to be crimped with the terminal sections 54G1, 54S, and 54G2 formed at the upper portion of the other display body 50u using anisotropic conductive film.

Note that, when the display devices 52 adjacent to each other in the first direction are to be jointed together, the elongated flexible circuit board 51 of one display device 52 may be fixed to the face opposite to the display face of the display body 50u in the other display device 52, using, for example, adhesive, double-faced tape (not illustrated), or the like, in addition to the fixation using anisotropic conductive film.

Figure 8:
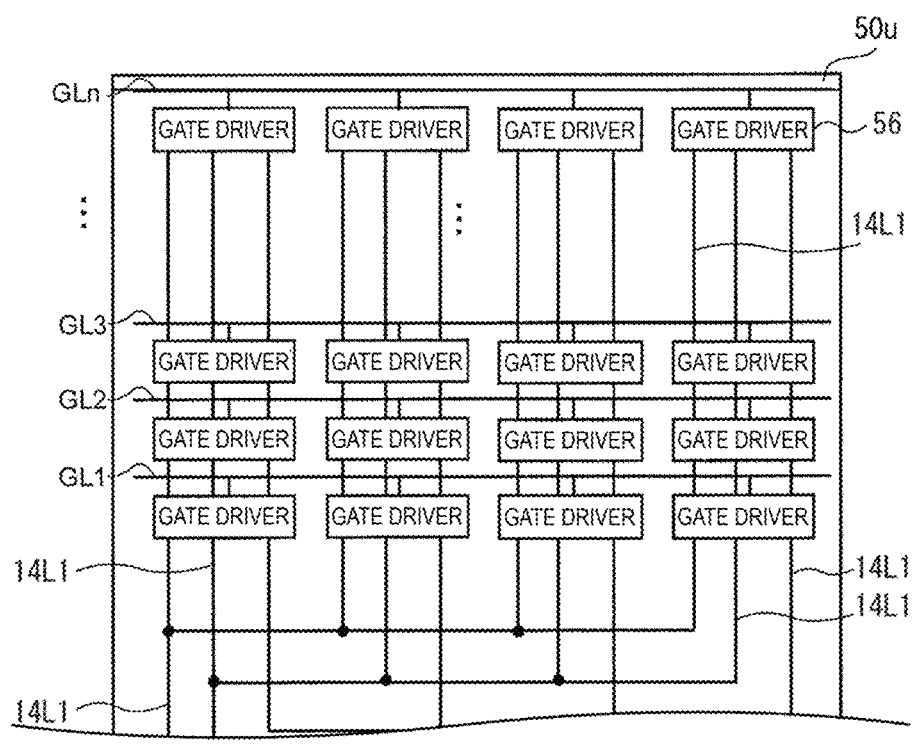
FIG. 8 is a diagram illustrating an overall configuration of a display region of the display body illustrated in FIGS. 7A to 7D.

FIG. 8 is a diagram illustrating an overall configuration of the display body 50u.

In the display region of the display body 50u illustrated in FIG. 8, the plurality of gate drivers 56 are each provided in a form of gate driver monolithic circuitry (GDM).

As illustrated in the figure, the display region of each display body 50u is formed with gate signal lines GL1 . . . GLn, source signal lines (not illustrated), and the plurality of gate drivers 56.

Further, the plurality of gate drivers 56, which is configured to output signals (scanning signals) for controlling the thin layer transistors (not illustrated) provided in the display region of the display body 50u to the gate signal lines GL1 . . . GLn, is formed in the display region.

In addition, control signals are supplied from a display control circuit (not illustrated) which is optionally provided in an external circuit board (for example, a PCB), via wiring lines of the elongated flexible circuit board 51 and wiring lines 14L1 of each display body 50u, to each gate driver 56 of each display body 50u.

In this way, by using the display body 50u in which the gate driver is provided in a form of the gate driver monolithic circuitry (GDM) in the display region of the display body 50u, a process can be omitted, in which a flexible circuit board for electrically connecting the gate signal lines of the respective display bodies 50u to each other is caused to be crimped with and fixed to the display body 50u using anisotropic conductive film, and the productivity can be enhanced when the plurality of display bodies 50u are each position-adjusted and jointed together, and then fixed to the elongated flexible circuit board 51, which is illustrated in FIG. 7B.

Fourth Embodiment

Next, a fourth embodiment of the disclosure will be described below with reference to FIGS. 9A to 9C. The fourth embodiment differs from the first to third embodiments in that a flexible circuit board 63 and an elongated flexible circuit board 62 are caused to be bent and respective display bodies 61u adjacent to each other partially overlap in a plan view with each other. The other configurations are as described in the first to third embodiments. For convenience of descriptions, members having the same functions as those of the members illustrated in the views in the first to third embodiments are denoted by the same reference numerals, and descriptions thereof will be omitted.

Figure 9A:
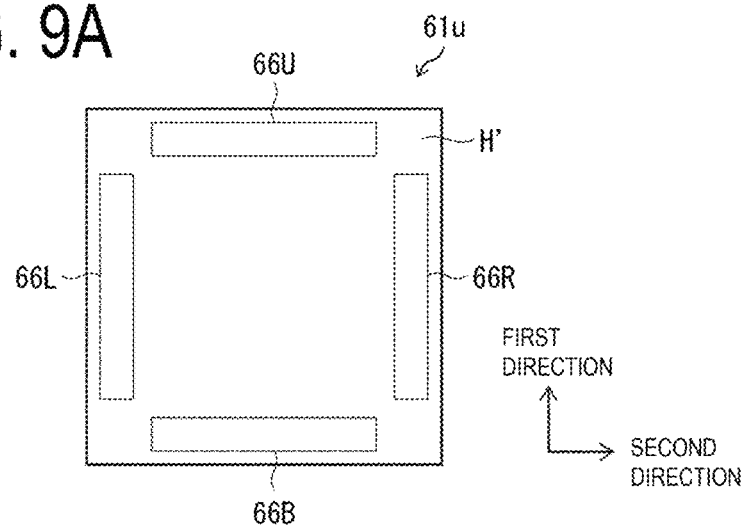
FIG. 9A is a view illustrating an overall configuration of the terminal sections of a display body.

FIG. 9A is a view illustrating terminal sections 66U, 66R, 66B, and 66L provided on the opposite face H' to the display face of the display body 61u.

The terminal sections 66U and 66B each form the terminal section of a plurality of source signal lines provided in the display region DA of the display body 61u, while the terminal sections 66R and 66L each form the terminal section of a plurality of gate signal lines provided in the display region DA of the display body 61u.

Figure 9B:
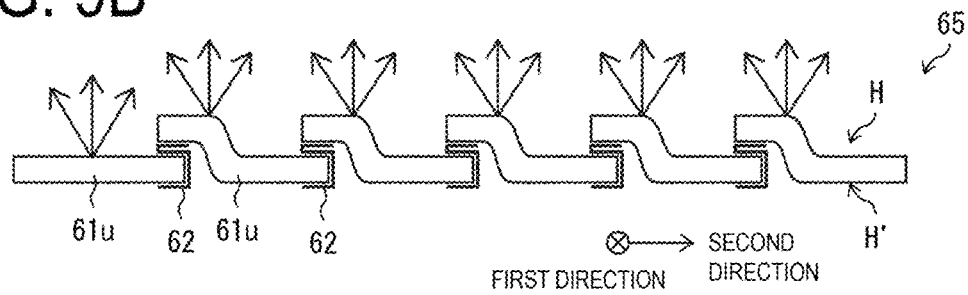
FIG. 9B and FIG. 9C are side views of the display device.
Figure 9C:
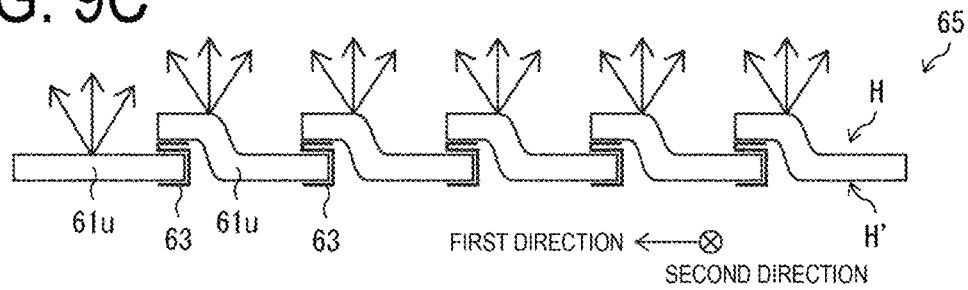

FIG. 9B and FIG. 9C are side views of the display device 65 formed of a plurality of display bodies 61u each including the elongated flexible circuit board 62 and the flexible circuit board 63 that are fixed to terminal sections provided on the opposite face H' to the display face H in the display body 61u.

As illustrated in FIG. 9B, the elongated flexible circuit board 62 electrically connected to the terminal section 66R formed at the right end portion of one display body 61u of two respective display bodies 61u adjacent to each other in the second direction in the figure is caused to be crimped with the terminal section 66L formed at the left end portion of the other display body 61u using anisotropic conductive film.

As in the elongated flexible circuit board 33 illustrated in FIGS. 1A to 1D and FIG. 2, the elongated flexible circuit board 62 commonly provided to the plurality of display bodies 61u in the first direction is caused to be bent such that the respective faces on each of which wiring lines are formed on the elongated flexible circuit board 62, avoiding contact with each other. Further, the respective back faces of the faces on each of which wiring lines are formed at the bending portion of the elongated flexible circuit board 62 arranged to be interposed between respective adjacent display bodies 61u may be fixed to each other using adhesive, double-faced tape (not illustrated), or the like.

In addition, the terminal section 66R formed at the right end portion of one display body 61u of two respective display bodies 61u adjacent to each other in the second direction in the figure overlaps in a plan view with the terminal section 66L formed at the left end portion of the other display body 61u.

Note that, in FIG. 9B, the display body 61u, which appears to be formed with a step portion, is a flexible organic EL display device of thin thickness, thus, the step portion is hardly visible when viewed from the display face H of the display body 61u.

As illustrated in FIG. 9C, the flexible circuit board 63 electrically connected to the terminal section 66B formed at the lower end portion of one display body 61u of two respective display bodies 61u adjacent to each other in the first direction in the figure is caused to be crimped with the terminal section 66U formed at the upper end portion of the other display body 61u using anisotropic conductive film.

The flexible circuit board 63 is caused to be bent such that the respective faces on each of which wiring lines are formed on the flexible circuit board 63 avoid contact with each other. Further, the respective back faces of the faces on each of which wiring lines are formed at the bending portion of the elongated flexible circuit board 63 arranged to be interposed between respective display bodies 61u may be fixed to each other using adhesive, double-faced tape (not illustrated), or the like.

In addition, the terminal section 66B formed at the lower end portion of one display body 61u of two respective display bodies 61u adjacent to each other in the first direction in the figure overlaps in a plan view with the terminal section 66U formed at the upper end portion of the other display body 61u.

Note that, in FIG. 9C, the display body 61u, which appears to be formed with a step portion, is a flexible organic EL display device of thin thickness, thus, the step portion is hardly visible when viewed from the display face H of the display body 61u.

In this way, the terminal sections 66U and 66B each allow the source signal lines provided at an identical position on each of two respective display bodies 61u adjacent to each other in the first direction in the figure to be electrically connected to each other via the flexible circuit board 63.

The terminal sections 66R and 66L each allow the gate signal lines provided at an identical position on each of two respective display bodies 61u adjacent to each other in the second direction in the figure to be electrically connected to each other via the elongated flexible circuit board 62.

In this way, the display device 65 with high productivity and high image quality can be achieved.

Note that, in the fourth embodiment, a case is described as an example, in which the terminal sections 66U and 66B each form the terminal section of a plurality of source signal lines provided in the display region DA of the display body 61u, and the terminal sections 66R and 66L each form the terminal section of a plurality of gate signal lines provided in the display region DA of the display body 61u, the terminal sections 66U and 66B may each form the terminal section of a plurality of gate signal lines provided in the display region DA of the display body 61u and the terminal sections 66R and 66L may each form the terminal section of a plurality of source signal lines provided in the display region DA of the display body 61u, without being limited to the above.

Further, in such a case, at each of the terminal sections 66U and 66B, the gate signal lines provided at an identical position on each of two respective display bodies 61u adjacent to each other in the first direction in the figure may be connected to each other via the flexible circuit board 63, and at each of the terminal sections 66R and 66L, the source signal lines provided at an identical position on each of two respective display bodies 61u adjacent to each other in the second direction in the figure may be connected to each other via the elongated flexible circuit board 62.

Fifth Embodiment

Next, a fifth embodiment of the disclosure will be described with reference to FIG. 10 and FIGS. 11A to 11C. The fifth embodiment differs from the first to fourth embodiments in that a display body 71u serves as a top emission-type organic EL display device, in which conductive bodies 74 and 76 formed in a through hole are used to fix an elongated flexible circuit board 72 and a flexible circuit board 73 to the opposite face H' of the display body 71u, which is a face opposite to the display face H of the display body 71u. The other configurations are as described in the first to fourth embodiments. For convenience of descriptions, members having the same functions as those of the members illustrated in the diagrams in the first to fourth embodiments are denoted by the same reference numerals, and descriptions thereof will be omitted.

Figure 10:
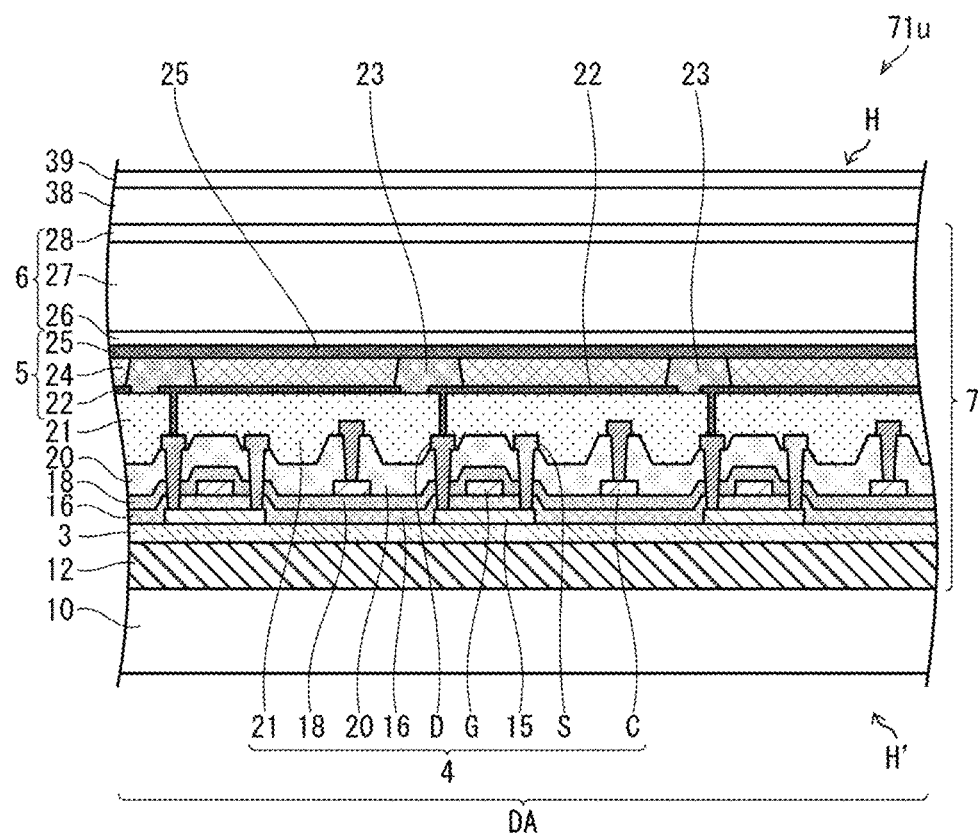
FIG. 10 is a view illustrating an overall configuration of a display region of a display body provided in another display device.

FIG. 10 is a view illustrating an overall configuration of the display region DA of the display body 71u.

As illustrated in FIG. 10, in the display region DA of the display body 71u, the face opposite to the face (the opposite face H') exteriorly exposed in the flexible board 10 is the display face H of the display body 71u.

Further, the functional layer 39 including a touch panel or a polarizer is attached to the upper layer of the second inorganic sealing film 28 via the adhesive layer 38 made of optical clear adhesive (OCA) or optical clear resin (OCR), and the face opposite to the face (the display face H) exteriorly exposed in the functional layer 39 is the opposite face H' of the display body 71u.

Note that, in the fifth embodiment, in order to render a face through which light emitted from the plurality of organic EL light-emitting elements 5 being provided in each display body 71u passes form the display face H of the display body 71u, the first electrode (anode electrode) 22 is formed by layering an Indium Tin Oxide (ITO) and an alloy containing Ag, and the second electrode (for example, cathode electrode) 25 is formed with a transparent metal such as an Indium Tin Oxide (ITO) or an Indium Zinc Oxide (IZO), for example.

FIG. 11A is a side view of a display device 75 in which the conductive bodies 74 and 76 formed in a through hole are caused to fix the elongated flexible circuit board 72 and the flexible circuit board 73 to the opposite face H' of the display body 71u, which is a face opposite to the display face H of the display body 71u, FIG. 11B is a view partially illustrating a display device 77 formed of a group of display bodies elongated in the first direction when viewed from the display face H, and FIG. 11C is a view partially illustrating the display device 77 formed of a group of display bodies elongated in the first direction when viewed from the opposite face H' to the display face H.

The display body 71u constituting a display device 75 illustrated in FIG. 11A causes the conductive bodies 74 and 76 formed in a through hole to form the terminal section on the opposite face H' of the display body 71u, which is a face opposite to the display face H of the display body 71u, and to fix the elongated flexible circuit board 72 and the flexible circuit board 73 to the opposite face H'.

As illustrated in FIGS. 11B and 11C, each of a plurality of display devices 77 each formed of a group of display bodies elongated in the first direction, where the display devices 77 constitute the display device 75, allows the elongated flexible circuit board 72 and the flexible circuit board 73 to be provided on the opposite face H' of the display body 71u, which is a face opposite to the display face H of the display body 71u.

In this way, the display devices 75 and 77 with high productivity and high image quality can be achieved.

Sixth Embodiment

Next, a sixth embodiment of the disclosure will be described below with reference to FIGS. 12A to 12D. The sixth embodiment differs from the third embodiment in that a gate driver 82 (gate drive circuit) is provided in a form of gate driver monolithic circuitry (GDM) at an end portion of a display body 81u. The other configurations are as described in the third embodiment. For convenience of explanation, members having the same function as those illustrated in the drawings of the third embodiment are denoted using the same reference numerals, and descriptions thereof will be omitted.

FIGS. 12A to 12D are views for explaining a method for manufacturing a display device 83 formed of a group of display bodies in which a plurality of display bodies 81u are jointed together and fixed to the elongated flexible circuit board 51, where the display body 81u includes the gate driver 82 provided in a form of gate driver monolithic circuitry (GDM) at an end portion of the display body 81u, and a method for manufacturing a display device in which the display devices 83 are further jointed together.

Figure 12A:
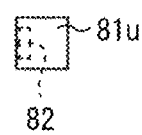
FIGS. 12A to 12D are views for explaining a method for manufacturing a display device formed of still another group of display bodies in which a plurality of display bodies are jointed together and fixed to an elongated flexible circuit board and a method for manufacturing a display device in which the plurality of groups of display bodies are jointed together.

As illustrated in FIG. 12A, the gate driver 82 is provided in a form of gate driver monolithic circuitry (GDM) at an end portion of the display body 81u.

Figure 12B:
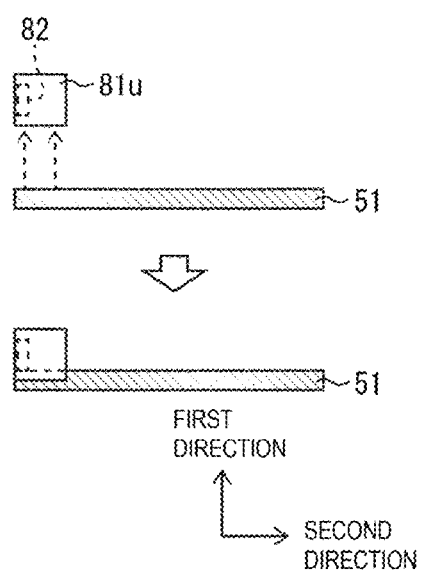

Then, in order to manufacture a display device in which the plurality of display bodies 81u each provided with the gate driver 82 are jointed together to enlarge the size of the display region, as illustrated in FIG. 12B, one piece of the elongated flexible circuit board 51 is caused to be crimped with the terminal section of each of the plurality of display bodies 81u using anisotropic conductive film.

Note that the terminal sections of each display body 81u can be formed in the same manner as the terminal sections of each display body 50u illustrated in FIG. 7D, thus, the descriptions thereof are omitted.

The elongated flexible circuit board 51 includes a circuit board having a length (the length of the first side) in the second direction in the figure in each of a pluralities of display bodies 81u, that is, having a length in the second direction, where the length is not less than the total length of first sides in each of the pluralities of display bodies 81u in the horizontal direction.

Figure 12C:
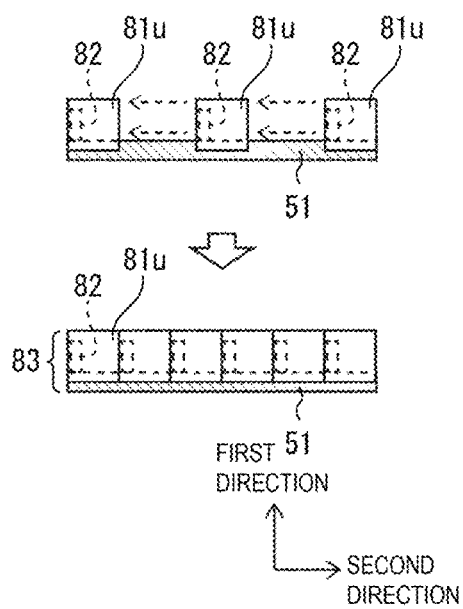

In addition, as illustrated in FIG. 12C, when one piece of the elongated flexible circuit board 51 is to be crimped with and fixed to the terminal section of each of the plurality of display bodies 81u using anisotropic conductive film, the display bodies 81u are jointed together and fixed to the elongated flexible circuit board 51 such that the horizontal sides (first sides) in six pieces of the display body 81u are aligned along the second direction being the longitudinal direction of the elongated flexible circuit board 51, to thus form the display device 83 formed of a group of display bodies elongated in the second direction.

The display device 83 allows the plurality of display bodies 81u to be jointed together and fixed to the elongated flexible circuit board 51, thus making it possible to achieve a display device with high productivity and high image quality.

As illustrated in FIG. 12C when the plurality of display bodies 81u is fixed to one piece of the elongated flexible circuit board 51, the plurality of display bodies 81u are each position-adjusted and jointed together, and then fixed to one piece of the elongated flexible circuit board 51 such that the horizontal sides (first sides) in the display bodies 81u are aligned along the second direction being the longitudinal direction of the elongated flexible circuit board 51, thus providing high productivity.

Figure 12D:
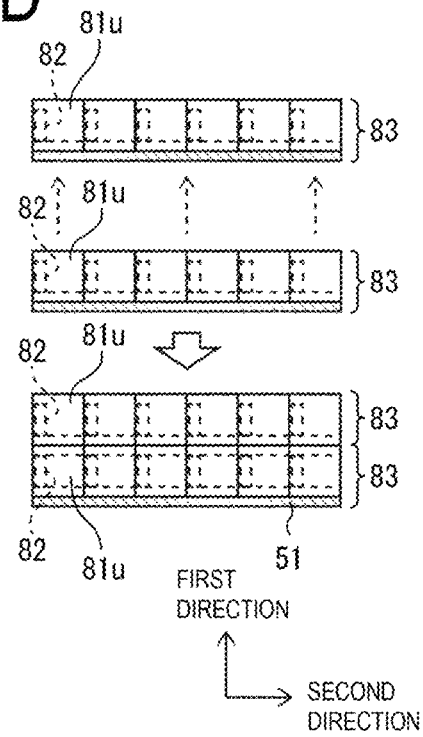
Figure 13A:
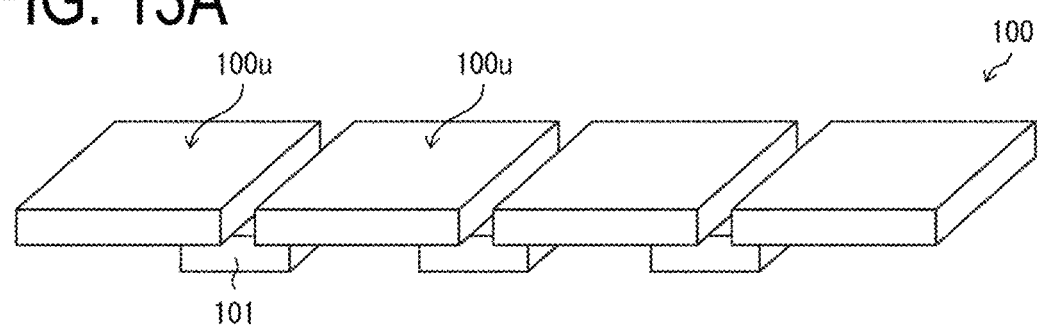
FIGS. 13A and 13B are views for explaining an issue in an electronic device in which a plurality of display modules described in PTL 1 are coupled to each other by a plurality of flexible circuit boards to enlarge the display size.
Figure 13B:
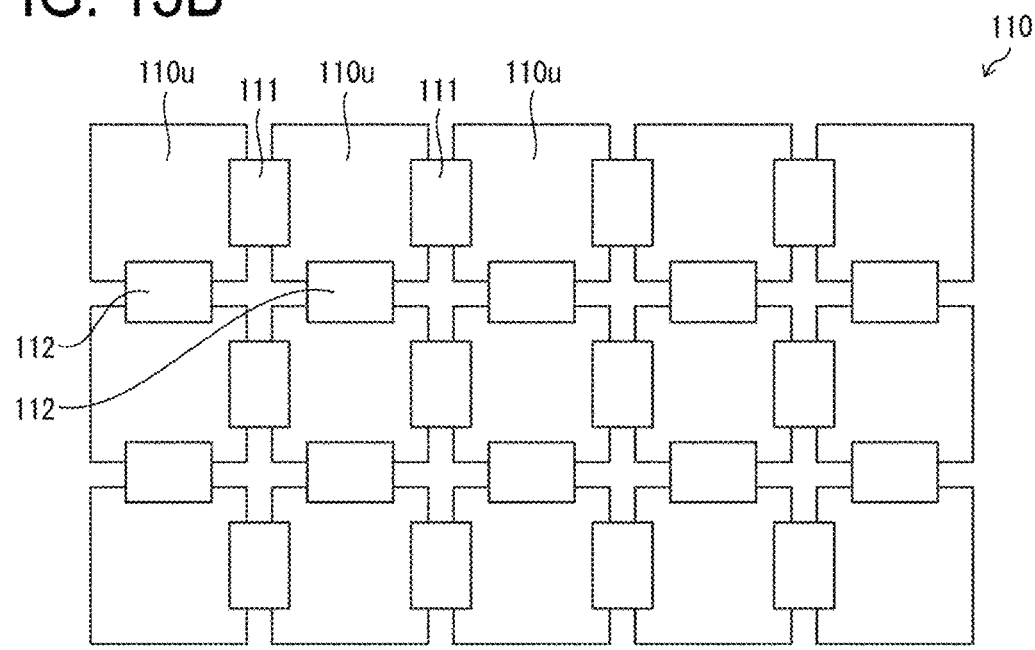
Figure 14A:
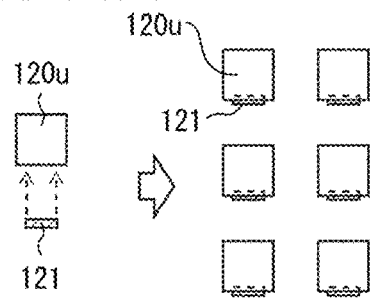
FIGS. 14A to 14D are views for explaining an issue caused when manufacturing a display device, where a plurality of display bodies each provided with a flexible circuit board on which a source driver is mounted and a flexible circuit board on which a gate driver is mounted, are jointed together to enlarge the display size.
Figure 14B:
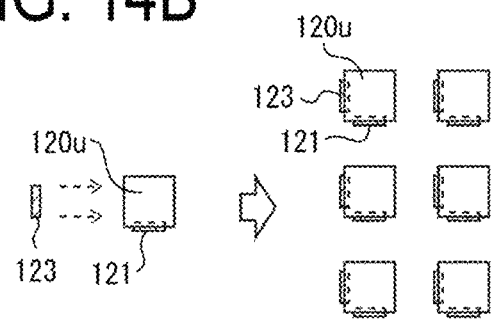
Figure 14C:
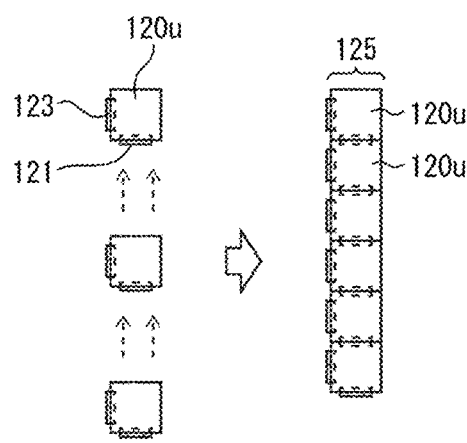
Figure 14D:
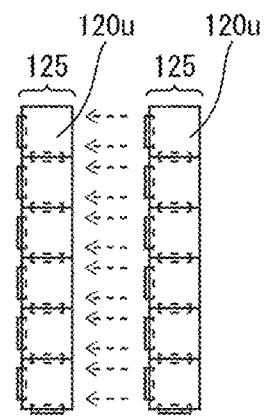

Further, in order to manufacture a display device in which the display devices 83 each formed of a group of display bodies elongated in the second direction are jointed together in the first direction in the figure to manufacture a display device the size of the display region of which is further enlarged, a plurality of display devices 83, as illustrated in FIG. 12D, are jointed together along the first direction orthogonal to the second direction, to thus make it possible to achieve a display device the size of the display region of which is enlarged in the first direction as well.

Note that, when the display devices 83 adjacent to each other in the first direction are to be jointed together, the elongated flexible circuit board 51 in one display device 83 may be fixed to the face opposite to the display face of the display body 81u in the other display device 83, using, for example, adhesive, double-faced tape (not illustrated), or the like, in addition to the fixation using anisotropic conductive film.

In this way, by using the display body 81u in which the gate driver 82 is provided in a form of the gate driver monolithic circuitry (GDM) at an end portion of the display body 81u, a process can be omitted, in which the flexible circuit board is caused to be crimped with and fixed to the display body 81u using anisotropic conductive film, and the productivity can be enhanced when the plurality of display bodies 81u are each position-adjusted and jointed together, and then fixed to the elongated flexible circuit board 51, which is illustrated in FIG. 12C.

Supplement

In order to address the above issue, a display device according to a first aspect of the disclosure is configured to include a plurality of display bodies and a circuit board, wherein the circuit board is an elongated circuit board having a length not less than a total length of first sides, the first side being in each of the plurality of display bodies, the plurality of display bodies are jointed together and fixed to the elongated circuit board such that the first sides in the plurality of display bodies are aligned along a longitudinal direction of the elongated circuit board, and the elongated circuit board is provided with a plurality of wiring lines each electrically connected to one of a plurality of gate signal lines and a plurality of source signal lines in each of the plurality of display bodies.

The above configuration allows the plurality of display bodies to be jointed together and fixed to the elongated circuit board, thus making it possible to achieve a display device with high productivity and high image quality.

The display device according to a second aspect of the disclosure may be configured, in the first aspect, such that the elongated circuit board is a flexible circuit board.

The above configuration allows for a display device in which the elongated circuit board is a flexible circuit board.

The display device according to a third aspect of the disclosure may be configured, in the first or second aspect, such that the elongated circuit board is provided with a plurality of wiring lines each electrically connected to the plurality of gate signal lines in each of the plurality of display bodies, the circuit board includes the elongated circuit board and a plurality of short circuit boards each having a length less than a length of the elongated circuit board, the plurality of short circuit boards are each provided, in the longitudinal direction, to fix two respective adjacent display bodies among the plurality of display bodies, and the plurality of short circuit boards are each provided with a plurality of wiring lines each electrically connected to the plurality of source signal lines in each of the two respective adjacent display bodies.

The above configuration allows for a display device provide with the plurality of short circuit boards.

The display device according to a fourth aspect of the disclosure may be configured, in the first or second aspect, such that the elongated circuit board is provided with a plurality of wiring lines each electrically connected to the plurality of source signal lines in each of the plurality of display bodies, the circuit board includes the elongated circuit board and a plurality of short circuit boards each having a length less than a length of the elongated circuit board, the plurality of short circuit boards are each provided, in the longitudinal direction, to fix two respective adjacent display bodies among the plurality of display bodies, and the plurality of short circuit boards are each provided with a plurality of wiring lines each electrically connected to the plurality of gate signal lines in each of the two respective adjacent display bodies.

The above configuration allows for a display device provide with the plurality of short circuit boards.

The display device according to a fifth aspect of the disclosure may be configured, in the third aspect, such that there are provided a plurality of groups of display bodies each including the plurality of display bodies fixed to the elongated circuit board, the plurality of groups of display bodies are jointed together along a direction orthogonal to the longitudinal direction, and the plurality of wiring lines in the elongated circuit board of groups of display bodies other than a group of display bodies arranged at one end portion in the direction orthogonal to the longitudinal direction, are each electrically connected to a plurality of gate signal lines in each of two respective adjacent display bodies in the direction orthogonal to the longitudinal direction.

The above configuration allows for a further large display device.

The display device according to a sixth aspect of the disclosure may be configured, in the fourth aspect, such that there are provided a plurality of groups of display bodies each including the plurality of display bodies fixed to the elongated circuit board, the plurality of groups of display bodies are jointed together along a direction orthogonal to the longitudinal direction, and the plurality of wiring lines in the elongated circuit board of groups of display bodies other than a group of display bodies arranged at one end portion in the direction orthogonal to the longitudinal direction, are each electrically connected to a plurality of source signal lines in each of two respective adjacent display bodies in the direction orthogonal to the longitudinal direction.

The above configuration allows for a further large display device.

The display device according to a seventh aspect of the disclosure may be configured, in any one of the third to sixth aspects, such that the short circuit board is a flexible circuit board.

The above configuration allows for a display device in which the short circuit board is a flexible circuit board.

The display device according to an eighth aspect of the disclosure may be configured, in the third or five aspect, such that the plurality of display bodies is each formed with a terminal section of the plurality of gate signal lines and a terminal section of the plurality of source signal lines that are formed on a face opposite to a display face of each of the plurality of display bodies, and the terminal section of the plurality of gate signal lines is electrically connected to the plurality of wiring lines of the elongated circuit board via anisotropic conductive film.

The above configuration allows for a display device in which the elongated circuit board is provided on the face opposite to the display face of each of the plurality of display bodies.

The display device according to a ninth aspect of the disclosure may be configured, in the fourth or six aspect, such that the plurality of display bodies is each formed with a terminal section of the plurality of gate signal lines and a terminal section of the plurality of source signal lines that are formed on a face opposite to a display face of each of the plurality of display bodies, and the terminal section of the plurality of source signal lines is electrically connected to the plurality of wiring lines of the elongated circuit board via anisotropic conductive film.

The above configuration allows for a display device in which the elongated circuit board is provided on the face opposite to the display face of each of the plurality of display bodies.

The display device according to a tenth aspect of the disclosure may be configured, in the eighth aspect, such that the terminal section of the plurality of source signal lines is electrically connected to the plurality of wiring lines of the short circuit board via anisotropic conductive film.

The above configuration allows for a display device in which the short circuit board is provided on the face opposite to the display face of each of the plurality of display bodies.

The display device according to an eleventh aspect of the disclosure may be configured, in the ninth aspect, such that the terminal section of the plurality of gate signal lines is electrically connected to the plurality of wiring lines of the short circuit board via anisotropic conductive film.

The above configuration allows for a display device in which the short circuit board is provided on the face opposite to the display face of each of the plurality of display bodies.

The display device according to a twelfth aspect of the disclosure may be configured, in the eighth aspect, such that two respective adjacent display bodies, in a direction orthogonal to the longitudinal direction, partially overlap in a plan view with each other, the terminal sections of the plurality of gate signal lines in the two respective adjacent display bodies overlap in a plan view with each other and the elongated circuit board may be caused to be bent.

The above configuration allows for a display device in which two respective adjacent display bodies partially overlap in a plan view with each other.

The display device according to a thirteenth aspect of the disclosure may be configured, in the ninth aspect, such that two respective adjacent display bodies, in a direction orthogonal to the longitudinal direction, partially overlap in a plan view with each other, the terminal sections of the plurality of source signal lines in the two respective adjacent display bodies overlap in a plan view with each other, and the elongated circuit board is caused to be bent.

The above configuration allows for a display device in which two respective adjacent display bodies partially overlap in a plan view with each other.

The display device according to a fourteenth aspect of the disclosure may be configured, in the tenth aspect, such that two respective adjacent display bodies, in the longitudinal direction, partially overlap in a plan view with each other, the terminal sections of the plurality of source signal lines in the two respective adjacent display bodies overlap in a plan view with each other, and the short circuit board is caused to be bent.

The above configuration allows for a display device in which two respective adjacent display bodies partially overlap in a plan view with each other.

The display device according to a fifteenth aspect of the disclosure may be configured, in the eleventh aspect, such that two respective adjacent display bodies, in the longitudinal direction, partially overlap in a plan view with each other, the terminal sections of the plurality of gate signal lines in each of the two respective adjacent display bodies overlap in a plan view with each other, and the short circuit board is caused to be bent.

The above configuration allows for a display device in which two respective adjacent display bodies partially overlap in a plan view with each other.

The display device according to a sixteenth aspect of the disclosure may be configured, in the first or second aspect, such that there are provided, in each of display regions of each of the plurality of display bodies, a plurality of gate drive circuits configured to supply signals to the plurality of gate signal lines provided in each of the plurality of display bodies, and a plurality of wiring lines for supplying signals to the plurality of gate drive circuits, and the elongated circuit board is provided with a plurality of wiring lines each electrically connected to the plurality of source signal lines in each of the plurality of display bodies and a plurality of wiring lines each electrically connected to the plurality of wiring lines for supplying signals to the plurality of gate drive circuits.

The above configuration allows for a display device in which a plurality of gate drive circuits is provided within the display region of each of the plurality of display bodies.

The display device according to a seventeenth aspect of the disclosure may be configured, in the sixteenth aspect, such that the plurality of gate drive circuits is formed at an end portion within the display region of each of the plurality of display bodies.

The above configuration allows for a display device in which a gate drive circuit is provided at an end portion of each of the plurality of display bodies.

The display device according to an eighteenth aspect of the disclosure may be configured, in any one of the first to seventeenth aspects, such that the elongated circuit board includes wiring lines for supplying power supply voltages to each of the plurality of display bodies.

The above configuration reduces a wiring-line resistance of the wiring line for supplying high level power supply voltage.

The display device according to a nineteenth aspect of the disclosure may be configured, in any one of the first to eighteenth aspects, such that the plurality of display bodies are each a flexible display body.

The above configuration allows for a display device provided with a flexible display body.

The display device according to a twentieth aspect of the disclosure may be configured, in any one of the first to nineteenth aspects, such that the plurality of display bodies are each provided with a plurality of electroluminescence light-emitting elements.

The above configuration allows for a display device provided with electroluminescence light-emitting elements.

A method for manufacturing a display device according to twenty-first aspect of the disclosure, in order to address the above issue, is a method for manufacturing a display device provided with a plurality of display bodies and a circuit board, wherein the circuit board includes an elongated circuit board having a length not less than a total length of first sides in the plurality of display bodies, in a process of fixing the plurality of display bodies to the elongated circuit board, the plurality of display bodies are each position-adjusted and jointed together, and then fixed to the elongated circuit board such that the first sides in the plurality of display bodies are each aligned along the longitudinal direction of the elongated circuit board, to thus cause a plurality of wiring lines of the elongated circuit board to be each electrically connected to one of a plurality of gate signal lines and a plurality of source signal lines in each of the plurality of display bodies.

The above method allows, in a process of fixing the plurality of display bodies to the elongated circuit board, the plurality of display bodies to be each position-adjusted and jointed together, and then fixed to the elongated circuit board such that the first sides are each aligned along the longitudinal direction of the elongated circuit board, thus making it possible to achieve a method for manufacturing a display device with high productivity and high image quality.

In the method for manufacturing a display device according to a twenty-second aspect of the disclosure, in the twenty-first aspect, the elongated circuit board may be a flexible circuit board.

The above method allows for a method for manufacturing a display device in which the elongated circuit board is a flexible circuit board.

In the method for manufacturing a display device according to a twenty-third aspect of the disclosure, in the twenty-first or twenty-second aspect, in a process of fixing the plurality of display bodies to the elongated circuit board, a group of display bodies in which the plurality of display bodies are each fixed to the elongated circuit board is formed, and in jointing together and fixing the plurality of groups of display bodies, the plurality of groups of display bodies are each position-adjusted and jointed together, and then fixed along the direction orthogonal to the longitudinal direction, then the plurality of wiring lines in the elongated circuit board of groups of display bodies other than a groups of display body arranged at one end portion in the direction orthogonal to the longitudinal direction are each electrically connected to each of the one of the plurality of gate signal lines and the plurality of source signal lines in each of two respective adjacent display bodies in the direction orthogonal to the longitudinal direction.

The above method allows for a further large display device.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

Note that the flexible display device of the above embodiments may be any display panel that has flexibility, and is provided with bendable optical elements. The optical element is an optical element whose luminance and transmittance are controlled by an electric current, and examples of the electric current-controlled optical element include an organic Electro Luminescent (EL) display provided with an Organic Light Emitting Diode (OLED), an EL display such as an inorganic EL display provided with an inorganic light emitting diode, or a QLED display provided with a Quantum Dot Light Emitting Diode (QLED).

INDUSTRIAL APPLICABILITY

The disclosure can be utilized for a display device and a method for manufacturing the same.

REFERENCE SIGNS LIST 1, 35, 43, 45, 52, 55, 65, 75, 77, 83 Display device
1$u$, 50$u$, 61$u$, 71$u$, 81$u$ Display body
32, 40, 63, 73 Flexible circuit board (short circuit board)
33, 42, 51, 62, 72 Elongated flexible circuit board (elongated circuit board)
36U, 36R, 36B, 36L Terminal section
53S, 53G1, 53G2 Terminal section
54S, 54G1, 54G2 Terminal section
66U, 66R, 66B, 66L Terminal section
56, 82 Gate driver (gate drive circuit)
74, 76 Conductive body
H Display face
H' Opposite face

The invention claimed is:

1. A display device comprising:
a plurality of display bodies; and
a circuit board,
wherein the circuit board is an elongated circuit board having a length not less than a total length of first sides, the first side being in each of the plurality of display bodies,
the plurality of display bodies are jointed together and fixed to the elongated circuit board such that the first sides in the plurality of display bodies are aligned along a longitudinal direction of the elongated circuit board,
the elongated circuit board is provided with a plurality of wiring lines each electrically connected to one of a plurality of gate signal lines and a plurality of source signal lines in each of the plurality of display bodies,
the elongated circuit board is provided with a plurality of wiring lines each electrically connected to the plurality of gate signal lines in each of the plurality of display bodies,
the circuit board includes the elongated circuit board and a plurality of short circuit boards each having a length being less than a length of the elongated circuit board,
the plurality of short circuit boards are each provided, in the longitudinal direction, to fix two respective adjacent display bodies among the plurality of display bodies,
the plurality of short circuit boards are each provided with a plurality of wiring lines each electrically connected to the plurality of source signal lines in each of the two respective adjacent display bodies,
there are provided a plurality of groups of display bodies each including the plurality of display bodies fixed to the elongated circuit board,
the plurality of groups of display bodies are jointed together along a direction orthogonal to the longitudinal direction, and
the plurality of wiring lines in the elongated circuit board of groups of display bodies other than a group of display bodies arranged at one end portion in the direction orthogonal to the longitudinal direction, are each electrically connected to a plurality of gate signal lines in each of two respective adjacent display bodies in the direction orthogonal to the longitudinal direction.

2. The display device according to claim 1,
wherein the short circuit board is a flexible circuit board.

3. The display device according to claim 1,
wherein the plurality of display bodies are each formed with a terminal section of the plurality of gate signal lines and a terminal section of the plurality of source signal lines on a face opposite to a display face of each of the plurality of display bodies, and
the terminal section of the plurality of gate signal lines is electrically connected to the plurality of wiring lines of the elongated circuit board via anisotropic conductive film.

4. The display device according to claim 3,
wherein the terminal section of the plurality of source signal lines is electrically connected to the plurality of wiring lines of the short circuit board via anisotropic conductive film.

5. The display device according to claim 4,
wherein two respective adjacent display bodies, in the longitudinal direction, partially overlap in a plan view with each other,
the terminal sections of the plurality of source signal lines in the two respective adjacent display bodies overlap in a plan view with each other, and
the short circuit board is caused to be bent.

6. The display device according to claim 3,
wherein two respective adjacent display bodies, in a direction orthogonal to the longitudinal direction, partially overlap in a plan view with each other,
the terminal sections of the plurality of gate signal lines in the two respective adjacent display bodies overlap in a plan view with each other, and
the elongated circuit board is caused to be bent.

7. The display device according to claim 1,
wherein the elongated circuit board includes wiring lines for supplying power supply voltages to each of the plurality of display bodies.

8. The display device according to claim 1,
wherein the plurality of display bodies are each a flexible display body.

9. The display device according to claim 1,
wherein the plurality of display bodies are each provided with a plurality of electroluminescence light-emitting elements.

10. A display device comprising:
a plurality of display bodies; and
a circuit board,
wherein the circuit board is an elongated circuit board having a length not less than a total length of first sides, the first side being in each of the plurality of display bodies,
the plurality of display bodies are jointed together and fixed to the elongated circuit board such that the first sides in the plurality of display bodies are aligned along a longitudinal direction of the elongated circuit board,
the elongated circuit board is provided with a plurality of wiring lines each electrically connected to one of a plurality of gate signal lines and a plurality of source signal lines in each of the plurality of display bodies,
the elongated circuit board is provided with a plurality of wiring lines each electrically connected to the plurality of source signal lines in each of the plurality of display bodies,
the circuit board includes the elongated circuit board and a plurality of short circuit boards each having a length being less than a length of the elongated circuit board,
the plurality of short circuit boards are each provided, in the longitudinal direction, to fix two respective adjacent display bodies among the plurality of display bodies,
the plurality of short circuit boards are each provided with a plurality of wiring lines each electrically connected to the plurality of gate signal lines in each of the two respective adjacent display bodies,
there are provided a plurality of groups of display bodies each including the plurality of display bodies fixed to the elongated circuit board,
the plurality of groups of display bodies are jointed together along a direction orthogonal to the longitudinal direction, and
the plurality of wiring lines in the elongated circuit board of groups of display bodies other than a group of display bodies arranged at one end portion in the direction orthogonal to the longitudinal direction, are each electrically connected to a plurality of source signal lines in each of two respective adjacent display bodies in the direction orthogonal to the longitudinal direction.

11. The display device according to claim 10,
wherein the plurality of display bodies are each formed with a terminal section of the plurality of gate signal lines and a terminal section of the plurality of source signal lines on a face opposite to a display face of each of the plurality of display bodies, and the terminal section of the plurality of source signal lines is electrically connected to the plurality of wiring lines of the elongated circuit board via anisotropic conductive film.

12. The display device according to claim 11, wherein the terminal section of the plurality of gate signal lines is electrically connected to the plurality of wiring lines of the short circuit board via anisotropic conductive film.

13. The display device according to claim 11, wherein two respective adjacent display bodies, in a direction orthogonal to the longitudinal direction, partially overlap in a plan view with each other, the terminal sections of the plurality of source signal lines in the two respective adjacent display bodies overlap in a plan view with each other, and the elongated circuit board is caused to be bent.

14. The display device according to claim 12, wherein two respective adjacent display bodies, in the longitudinal direction, partially overlap in a plan view with each other, the terminal sections of the plurality of gate signal lines in the two respective adjacent display bodies overlap in a plan view with each other, and the short circuit board is caused to be bent.

15. The display device according to claim 10, wherein the elongated circuit board includes wiring lines for supplying power supply voltages to each of the plurality of display bodies.

16. The display device according to claim 10, wherein the plurality of display bodies are each a flexible display body.

17. A display device comprising:
a plurality of display bodies; and
a circuit board,
wherein the circuit board is an elongated circuit board having a length not less than a total length of first sides, the first side being in each of the plurality of display bodies, the plurality of display bodies are jointed together and fixed to the elongated circuit board such that the first sides in the plurality of display bodies are aligned along a longitudinal direction of the elongated circuit board, the elongated circuit board is provided with a plurality of wiring lines each electrically connected to one of a plurality of gate signal lines and a plurality of source signal lines in each of the plurality of display bodies, there are provided, in each of display regions of each of the plurality of display bodies, a plurality of gate drive circuits configured to supply signals to the plurality of gate signal lines provided in each of the plurality of display bodies, and a plurality of wiring lines for supplying signals to the plurality of gate drive circuits, and the elongated circuit board is provided with a plurality of wiring lines each electrically connected to the plurality of source signal lines in each of the plurality of display bodies and a plurality of wiring lines each electrically connected to the plurality of wiring lines for supplying signals to the plurality of gate drive circuits.

18. The display device according to claim 17, wherein the plurality of gate drive circuits are formed at an end portion within the display region of each of the plurality of display bodies.

19. The display device according to claim 17, wherein the elongated circuit board includes wiring lines for supplying power supply voltages to each of the plurality of display bodies.

20. The display device according to claim 17, wherein the plurality of display bodies are each a flexible display body.

* * * * *